(12) United States Patent
Khater

(10) Patent No.: US 8,106,456 B2
(45) Date of Patent: Jan. 31, 2012

(54) SOI TRANSISTORS HAVING AN EMBEDDED EXTENSION REGION TO IMPROVE EXTENSION RESISTANCE AND CHANNEL STRAIN CHARACTERISTICS

(75) Inventor: Marwan H. Khater, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 12/511,440

(22) Filed: Jul. 29, 2009

(65) Prior Publication Data

US 2011/0024840 A1    Feb. 3, 2011

(51) Int. Cl.
*H01L 27/12* (2006.01)

(52) U.S. Cl. .................. 257/347; 438/300; 257/E27.112

(58) Field of Classification Search .................. 257/347, 257/E27.112; 438/300
See application file for complete search history.

(56) References Cited

U.S. PATENT DOCUMENTS

| | | | |
|---|---|---|---|
| 6,407,427 B1 * | 6/2002 | Oh ................................. 257/347 |
| 6,521,949 B2 * | 2/2003 | Assaderaghi et al. ........ 257/347 |
| 6,936,875 B2 * | 8/2005 | Sugii et al. .................... 257/288 |
| 7,091,071 B2 * | 8/2006 | Thean et al. .................. 438/149 |
| 7,157,374 B1 | 1/2007 | Waite et al. |
| 7,309,660 B2 | 12/2007 | Chen |
| 7,368,358 B2 | 5/2008 | Ouyang et al. |
| 2006/0128105 A1 | 6/2006 | Ouyang et al. |
| 2006/0255330 A1 | 11/2006 | Chen et al. |
| 2007/0020864 A1 | 1/2007 | Chong et al. |
| 2007/0117334 A1 * | 5/2007 | Nayfeh et al. ................. 438/301 |
| 2007/0132038 A1 | 6/2007 | Chong et al. |
| 2007/0138570 A1 | 6/2007 | Chong et al. |
| 2007/0187776 A1 | 8/2007 | Sasaki |
| 2007/0235819 A1 | 10/2007 | Yagishita |
| 2007/0295989 A1 | 12/2007 | Han et al. |
| 2008/0054316 A1 * | 3/2008 | Xiang et al. .................. 257/288 |
| 2008/0054364 A1 | 3/2008 | Hokazono |
| 2008/0119025 A1 | 5/2008 | Kwon et al. |
| 2008/0217686 A1 | 9/2008 | Majumdar et al. |

* cited by examiner

*Primary Examiner* — Steven J Fulk

(74) *Attorney, Agent, or Firm* — Cantor Colburn LLP; Vazken Alexanian

(57) ABSTRACT

A silicon-on-insulator (SOI) transistor device includes a buried insulator layer formed over a bulk substrate; an SOI layer formed on the buried insulator layer; and a pair of silicon containing epitaxial regions disposed adjacent opposing sides of a gate conductor, the epitaxial regions corresponding to source and drain regions of the transistor device; wherein portions of the epitaxial regions are embedded in the buried insulator and are in contact with both vertical and bottom surfaces of the SOI layer corresponding to source and drain extension regions at opposing ends of a channel region of the transistor device.

21 Claims, 36 Drawing Sheets

SOI TRANSISTORS HAVING AN EMBEDDED EXTENSION REGION TO IMPROVE EXTENSION RESISTANCE AND CHANNEL STRAIN CHARACTERISTICS

BACKGROUND

The present invention relates generally to semiconductor device manufacturing and, more particularly, to silicon-on-insulator (SOI) transistors having improved extension resistance and channel strain characteristics.

Complementary metal oxide semiconductor (CMOS) field effect transistors (FETs) are employed in almost every electronic circuit application including, for example, signal processing, computing, and wireless communications. SOI transistors are those devices in which the active device area (including the FET channel) is formed in a relatively thin layer of silicon (or other semiconducting material) disposed over a buried insulating layer (such as an oxide, in which case the buried insulating layer is called a BOX). The buried insulating layer is in turn formed over a bulk (e.g., silicon) substrate. An advantage of SOI devices is the reduction of cross talk with other transistor devices, as well as the reduction of parasitic capacitance.

As transistor devices continue to scale, a reduction in FET gate size has also led to a decrease in the thickness of the SOI layer in order to control short channel effects. In fact, the so-called extremely thin SOI or ETSOI devices can have SOI thicknesses on the order of about 10 nanometers (nm) or less. On the other hand, such thin SOI devices lead to higher source/drain extension resistances, which may be mitigated to a certain extent by forming raised source/drain regions.

However, another obstacle to maintaining lower source/drain extension resistances in ETSOI devices is the loss of dopants due to diffusion through the ETSOI and into the BOX with conventional dopant activation processes. Moreover, there is also the problem of maintaining desirable channel strain properties in ETSOI devices, as it is well known that a tensile stress applied to a channel of an NFET device and a compressive stress applied to a channel of a PFET device increases the respective carrier mobilities thereof.

BRIEF SUMMARY

In an exemplary embodiment, a silicon-on-insulator (SOI) transistor device includes a buried insulator layer formed over a bulk substrate; an SOI layer formed on the buried insulator layer; and a pair of silicon containing epitaxial regions disposed adjacent opposing sides of a gate conductor, the epitaxial regions corresponding to source and drain regions of the transistor device; wherein portions of the epitaxial regions are in contact with both vertical and bottom surfaces of the SOI layer corresponding to source and drain extension regions at opposing ends of a channel region of the transistor device.

In another embodiment, a method of forming a silicon-on-insulator (SOI) transistor device includes forming a first sacrificial layer over a starting structure, the starting structure comprising a buried insulator layer formed over a bulk substrate, an SOI layer formed on the buried insulator layer, a gate conductor and gate insulator layer formed over the SOI layer, and a disposable spacer layer formed over and on sidewalls of the gate conductor; removing portions of the first sacrificial layer that are disposed adjacent opposing sides of the disposable spacer layer and gate conductor; removing corresponding exposed portions of the SOI layer disposed adjacent opposing sides of the disposable spacer layer and gate conductor; downwardly and laterally etching the buried insulator layer so as to expose both vertical and bottom surfaces of the SOI layer corresponding to source and drain extension regions at opposing ends of a channel region of the transistor device; and growing a pair of silicon containing epitaxial regions disposed adjacent opposing sides of a gate conductor, the epitaxial regions corresponding to source and drain regions of the transistor device and filling the etched portions of the buried insulator layer; wherein portions of the epitaxial regions are in contact with the vertical and bottom surfaces of the SOI layer corresponding to source and drain extension regions at the opposing ends of the channel region of the transistor device.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein are structures and methods of forming SOI transistors having an embedded extension region for improved extension resistance and channel strain characteristics. The embodiments may be applicable to ETSOI structures with both embedded and raised source/drain, as well as to thicker SOI devices. In brief, the embodiments utilize a lateral etch in the BOX layer so as to expose a portion of a bottom surface of the SOI layer (and substrate surface) corresponding to the location of the extension regions. In so doing, a subsequently formed epitaxial region may be formed in a manner so as to increase the interface between the SOI in the extension region and the epitaxial region. Thereby, the extension resistance may be kept low since part of the epitaxial region is disposed directly below the extension region, thus mitigating the diffusion of dopants to the buried oxide layer. In addition, the larger SOI/epitaxial region interface in the channel region increases the degree to which a tensile or compressive stress may be applied to the channel, in turn increasing carrier mobility even for ETSOI devices.

Figure 1:
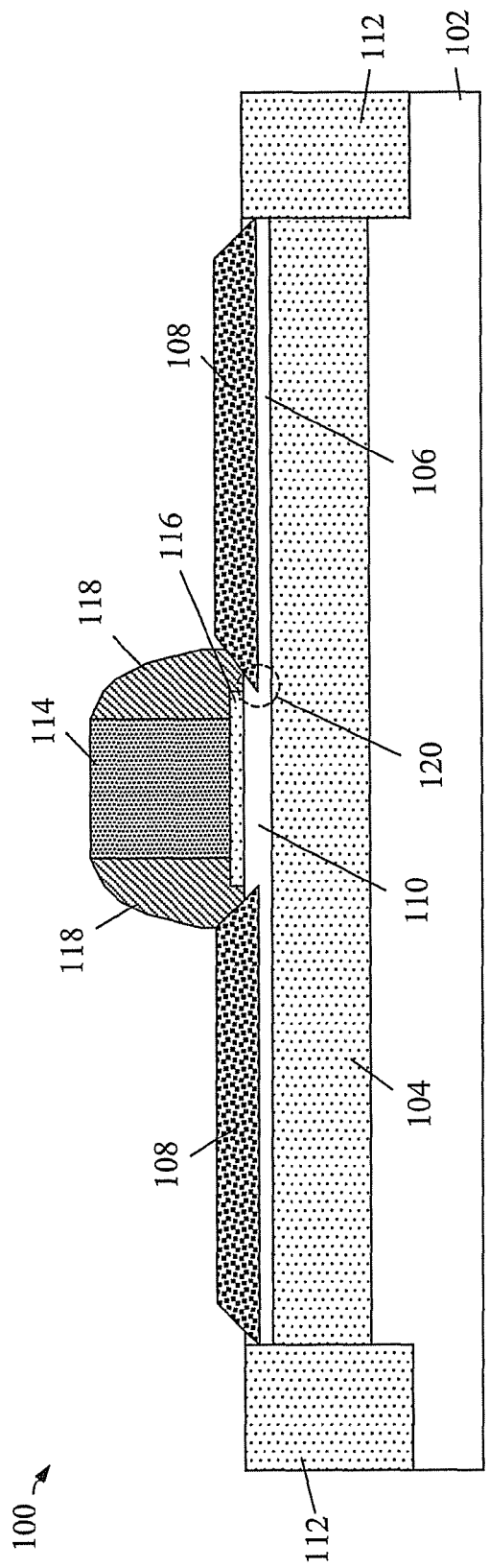
FIG. 1 is a cross-sectional view of a conventionally formed ETSOI transistor device.

Referring initially to FIG. 1, there is shown a cross-sectional view of a conventionally formed ETSOI transistor device 100. As is shown, a bulk substrate 102 (e.g., silicon) has a buried insulator layer 104 (in this instance a buried oxide layer or BOX) formed thereon. A thin silicon layer 106 is in turn formed over the BOX layer 104, although layer 106 could also be any other suitable semiconducting layer compatible with FET channel formation. As indicated above, an ETSOI such as layer 106 can be as thin as 10 nm or less. Accordingly, the fully depleted ETSOI device 100 of FIG. 1 further includes raised source/drain regions 108, formed by the epitaxial growth of a strain inducing material, such as silicon germanium (SiGe) or silicon carbide (SiC), depending on whether the transistor is a PFET device or an NFET device.

For example, to increase majority carrier mobility (i.e., electrons) in the channel region 110 of an NFET device, SiC is one suitable material that may be used to produce a tensile stress on the SOI channel 110. Conversely, to increase majority carrier mobility (i.e., holes) in the channel region 110 of a PFET device, SiGe is one suitable material that may be used to produce a compressive stress on the SOI channel 110.

One skilled in the art will also recognize other conventional structures associated with FET devices, including shallow trench isolation (STI) regions 112 (e.g., an oxide material) for providing electrical isolation between individual transistors, a gate electrode 114 disposed over the channel region 110 (e.g., polysilicon or other suitable conducting material), a gate dielectric layer 116 (e.g., oxide, nitride, oxynitride, etc.) to electrically isolate the gate electrode 114 from the SOI layer 106, and gate sidewall spacers 118 (e.g., nitride).

As also indicated above, an ETSOI FET device 100 as shown in FIG. 1 suffers from a high extension region resistance due to dopant loss to the BOX upon activation, given the thin SOI thickness, and due to the high resistance of such an extremely thin extension SOI thickness. Further, such a thin thickness of SOI decreases the interface between the epitaxially grown raised source/drain regions 108 and the channel region 110, as highlighted by the dashed circle 120 in FIG. 1, which results in a significant reduction in channel strain induced by the epitaxially grown raised source/drain regions 108.

Figure 2:
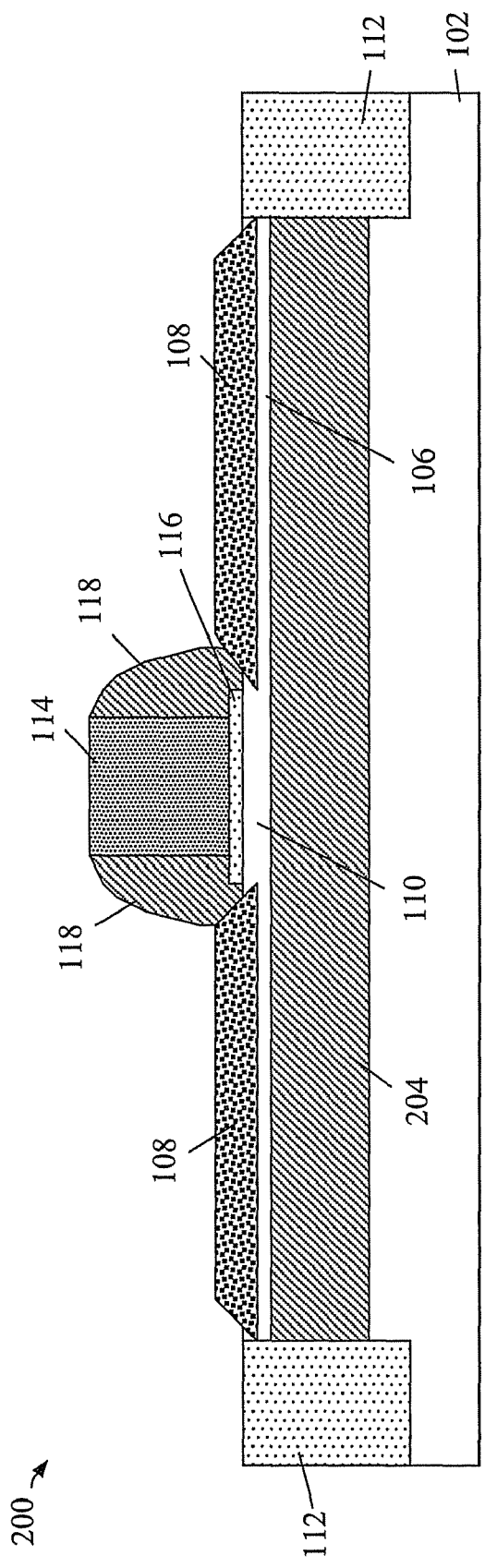
FIG. 2 is a cross-sectional view of another conventionally formed ETSOI transistor device.

There are several solutions presently in existence that attempt to address the decreased extension resistance and reduced strain problem associated with ETSOI devices. For example, FIG. 2 is a cross-sectional view of another conventionally formed ETSOI transistor device 200. It will be noted that for purposes of clarity and ease of description, like elements of subsequent figures will have like reference numbers and/or reference numbers may be omitted where elements do not vary from figure to figure. In any case, it will be noted that the transistor device 200 substitutes a buried nitride layer 204 for the BOX layer 104 of FIG. 1. Although this device helps to reduce dopant loss and improve extension resistance upon rapid thermal anneal (RTA) of the dopant with respect to an oxide BOX layer device (i.e., the dopant does not substantially diffuse through the thin SOI and into the buried nitride), it does not address the reduced strain problem since the geometry of the epitaxially grown raised source/drain regions 108 is substantially the same with respect to that of FIG. 1.

In the event it is desired to use a BOX layer for the ETSOI device, such as in FIG. 1, it is still possible to address the extension resistance problem by altering the dopant activation processing by performing source/drain extension implants last, and then activating the dopant ions by laser annealing instead of thermal annealing. While this technique will also improve extension resistance by reducing dopant loss to the BOX, it again does not address the channel strain problem associated with ETSOI devices.

Figure 3:
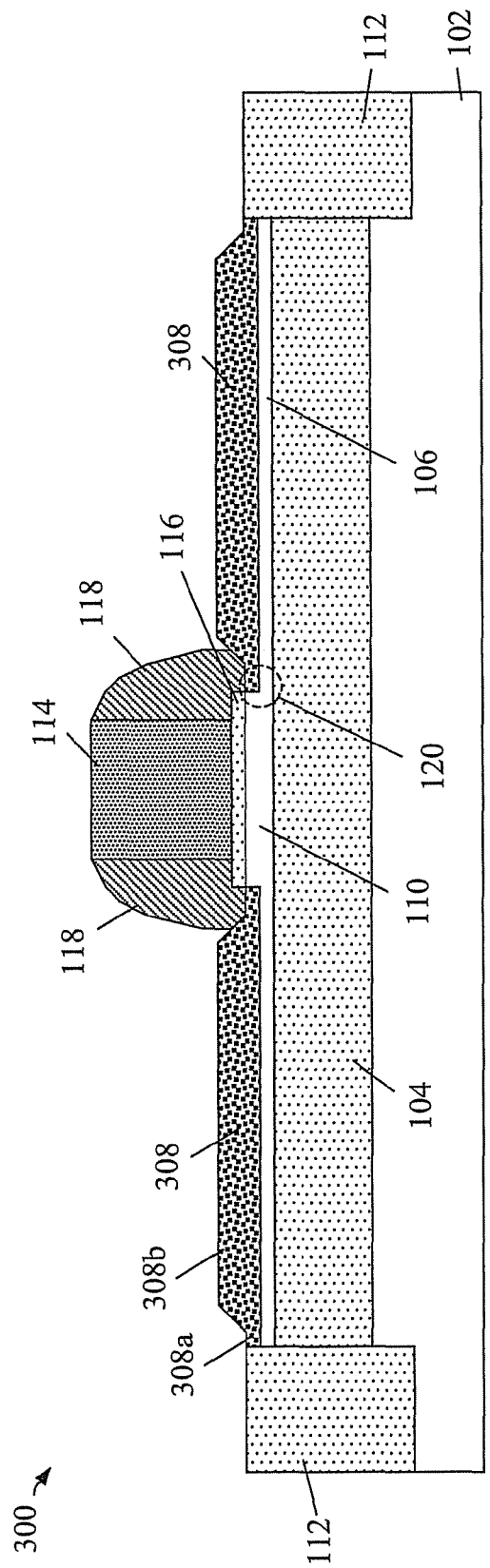
FIG. 3 is a cross-sectional view of another conventionally formed ETSOI transistor device.

Referring now to FIG. 3, there is shown a cross-sectional view of still another conventionally formed ETSOI transistor device 300. Here, the raised source/drain regions 308 are actually formed from two epitaxially grown layers 308a, 308b (using first and second sets of spacers), in combination with the above mentioned technique of performing extension implants last and activating the dopants through a laser anneal. Again, the first problem of decreased extension resistance is addressed through reduction in dopant loss. The device 300 of FIG. 3 also attempts to address the strain problem by providing a more vertical epitaxial region/SOI interface (illustrated by the dashed circle 320), due the two-step epitaxial growth layer 308. While this profile represents a slight geometric improvement with respect to FIG. 1, any marginal improvements in strain benefits are still outweighed by the extremely thin dimension of the SOI in the source/drain extension regions.

Figure 4:
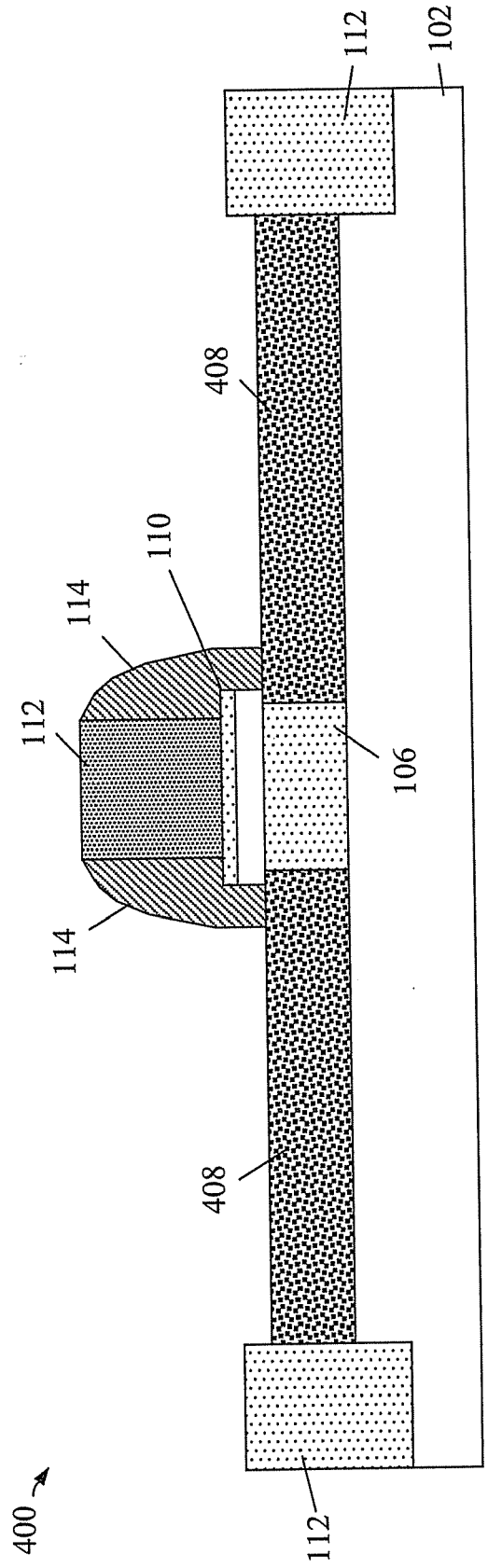
FIG. 4 is a cross-sectional view of a conventionally formed SOI transistor device.

FIG. 4 is a cross-sectional view of a conventionally formed SOI transistor device 400, in which the source/drain regions are recessed entirely down to the level of the bulk substrate 102, prior to epitaxial growth of the source/drain regions 408. This device 400 depicts the so-called "embedded" source/drain regions, in that they are not raised source/drain regions with respect to the bottom of the gate electrode 112. As a result, the device 400 provides desired channel strain properties similar to bulk substrate technologies but, on the other hand, exhibits high source to drain current leakage, as well as high source/drain to substrate capacitance due to most of the BOX being removed. This essentially negates the benefits of SOI technology in the first place.

Figure 5A:
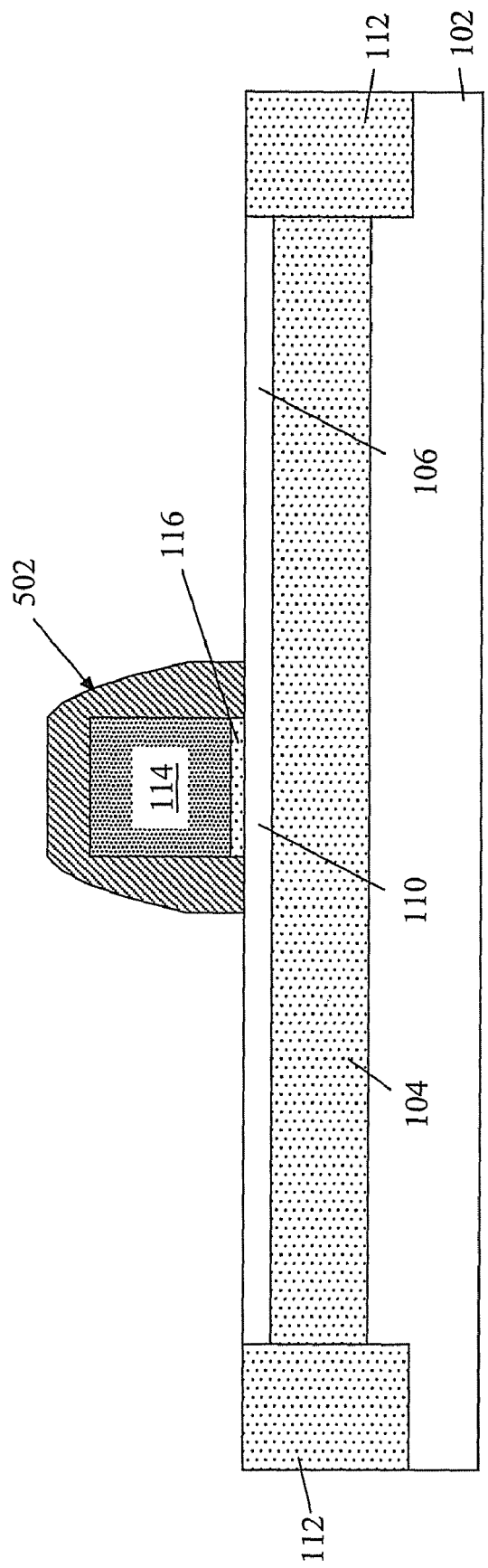
FIGS. 5(a) through 5(i) are a series of cross-sectional views illustrating a method of forming an ETSOI transistor having an embedded extension region for improved extension resistance and channel strain characteristics, in accordance with an embodiment of the invention.

Accordingly, FIGS. 5(a) through 5(i) are a series of cross-sectional views illustrating a method forming a novel ETSOI transistor having an embedded extension region for improved extension resistance and channel strain characteristics, in accordance with an exemplary embodiment of the invention. Beginning in FIG. 5(a), a point in device processing is depicted in which an SOI layer 106 is thinned (e.g., to ETSOI dimensions), STI regions 112 are formed within the bulk substrate 102, gate stack materials are deposited, patterned and etched to form the gate electrode 114 and gate dielectric layer 116. FIG. 5(a) further illustrates disposable spacer, liner and gate hardmask formation, collectively designated by 502.

Figure 5B:
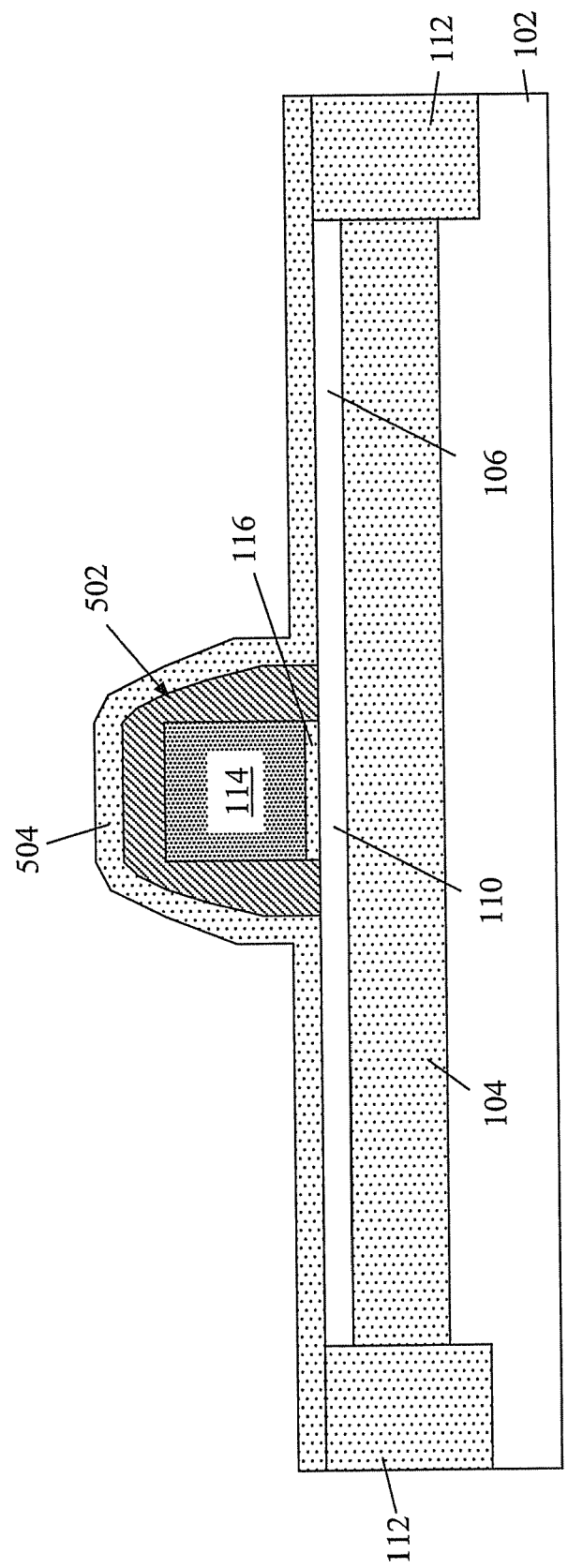

As then shown in FIG. 5(b), a sacrificial oxide liner layer 504 is deposited over the entire structure. Then, in FIG. 5(c), a photoresist layer 506 is deposited and patterned as known in the art to expose the gate electrode 114, the sacrificial spacer/hardmask layer 502, and vertical surfaces of the sacrificial oxide liner 504. The embodiment of this particular sequence is non self-aligned with respect to the gate in that photolithography is used to form an etch pattern, although as will be seen in subsequent embodiments, self-aligned techniques may also be used. In any case, an etch process is used to remove the exposed portions of the oxide liner 504, followed by another etch process to etch completely through the exposed portion of the ETSOI layer 106 at opposing ends of the channel region 110, and also slightly recessing into the BOX layer 104 as shown in FIG. 5(d). In FIG. 5(e), the resist layer is then stripped.

Figure 5C:
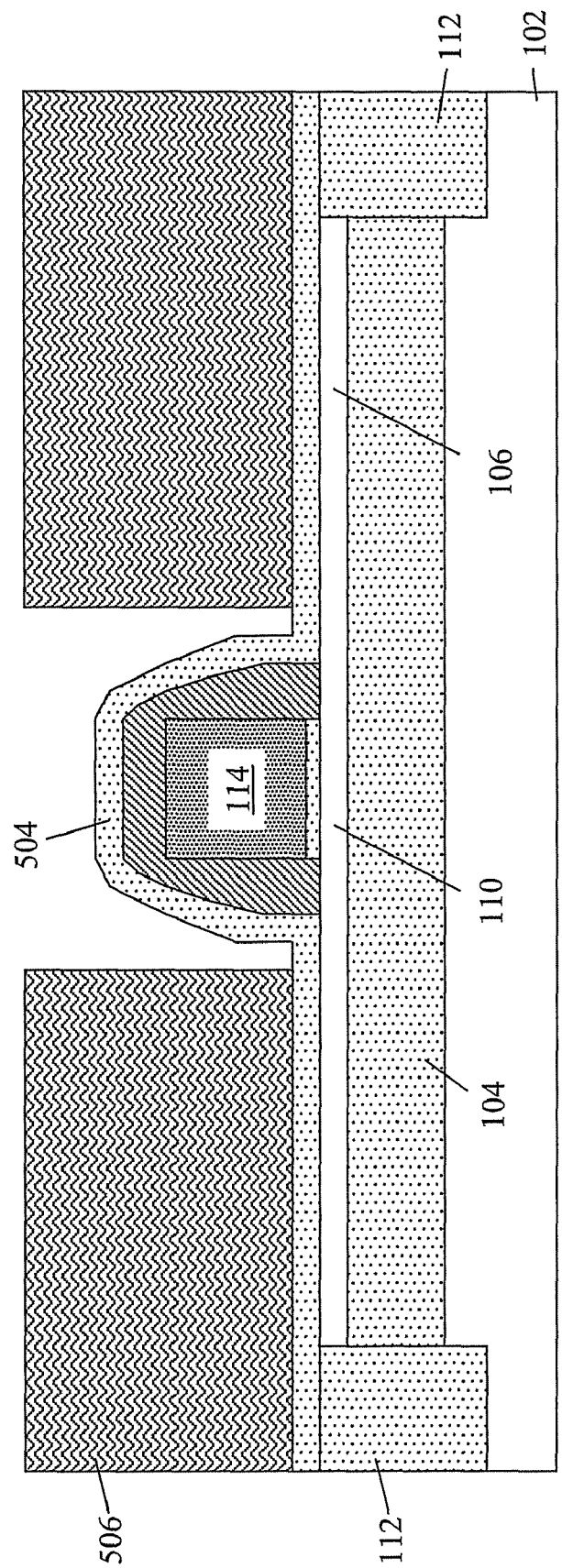
Figure 5D:
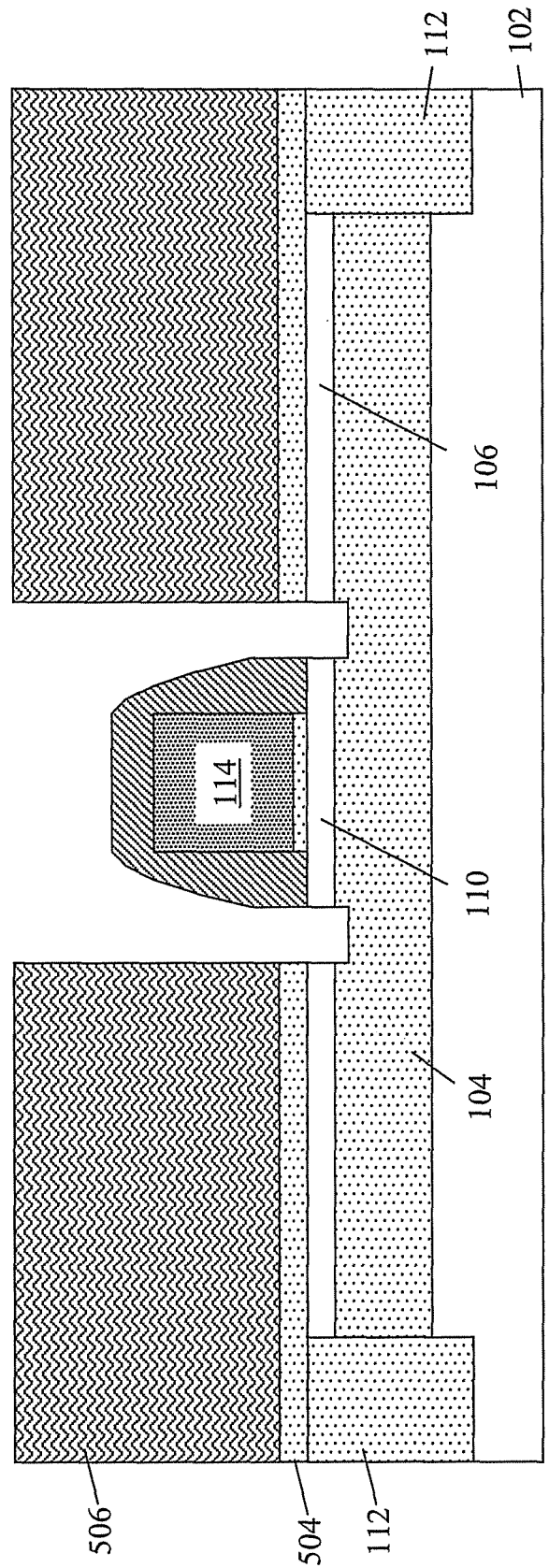
Figure 5E:
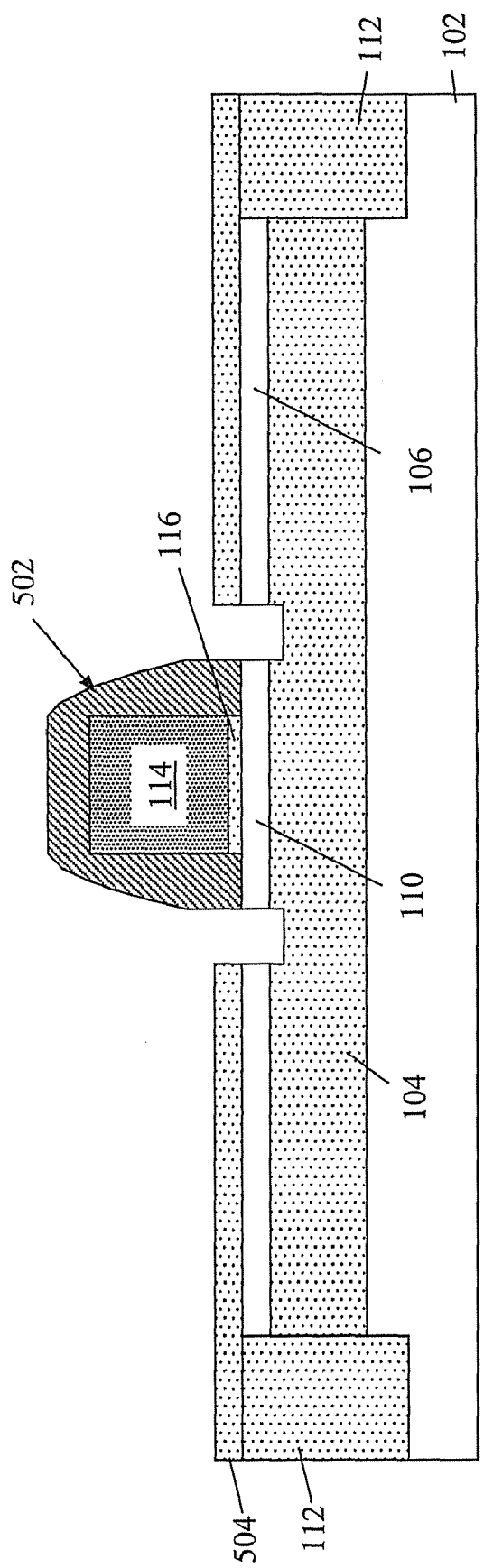
Figure 5F:
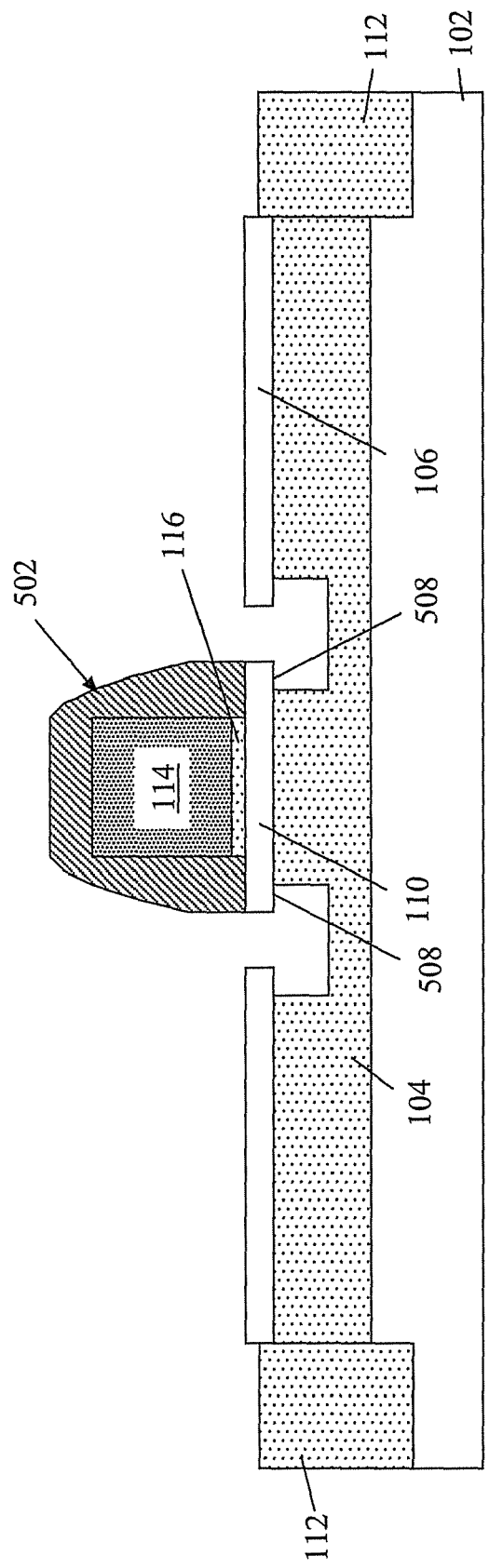
Figure 5G:
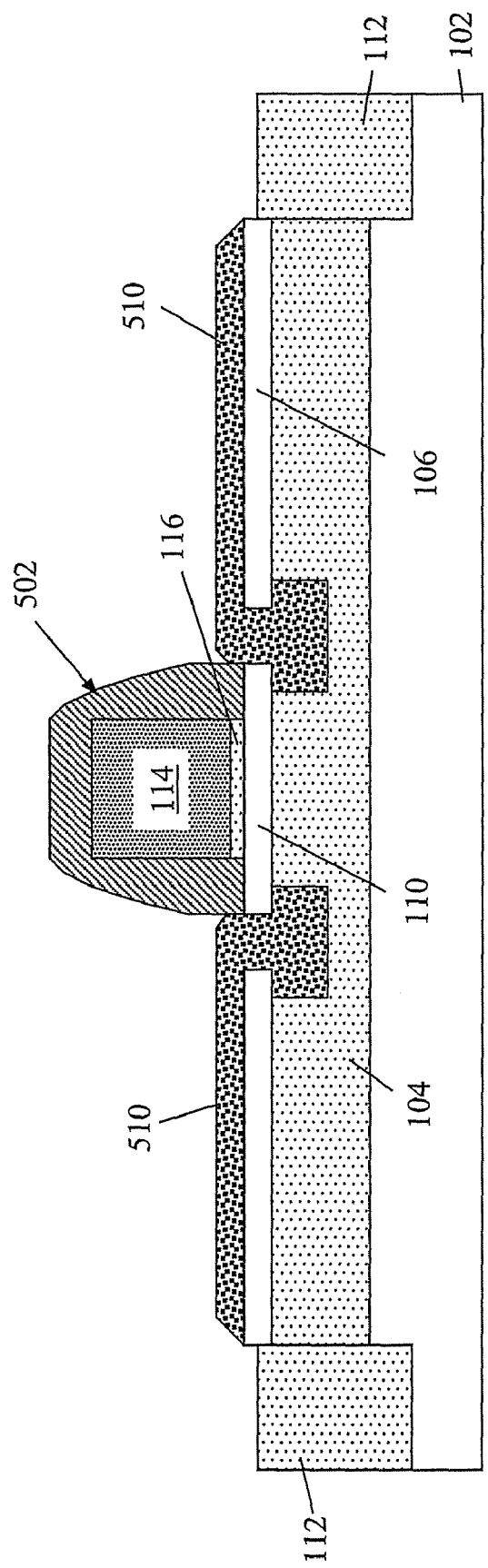

Proceeding next to FIG. 5(f), an isotropic oxide etch is then performed (such as a wet etch or a reactive ion etch (RIE), for example) in order to laterally etch the BOX layer 104 and expose a bottom surface 508 of the ETSOI layer 106 corresponding to the source/drain extension regions at opposing ends of the channel region 110. In so doing, the sacrificial oxide liner is also removed, but in so doing, protects against significant recessing of the STI regions 112. Then, as shown in FIG. 5(g), epitaxial growth of a suitable silicon-containing semiconductor material (e.g., SiGe, SiC, depending on the device polarity) is performed in order to define the embedded extension regions and the epitaxial raised source/drain regions 510. At this point in the process, extension (and halo) implants may be performed.

Figure 5H:
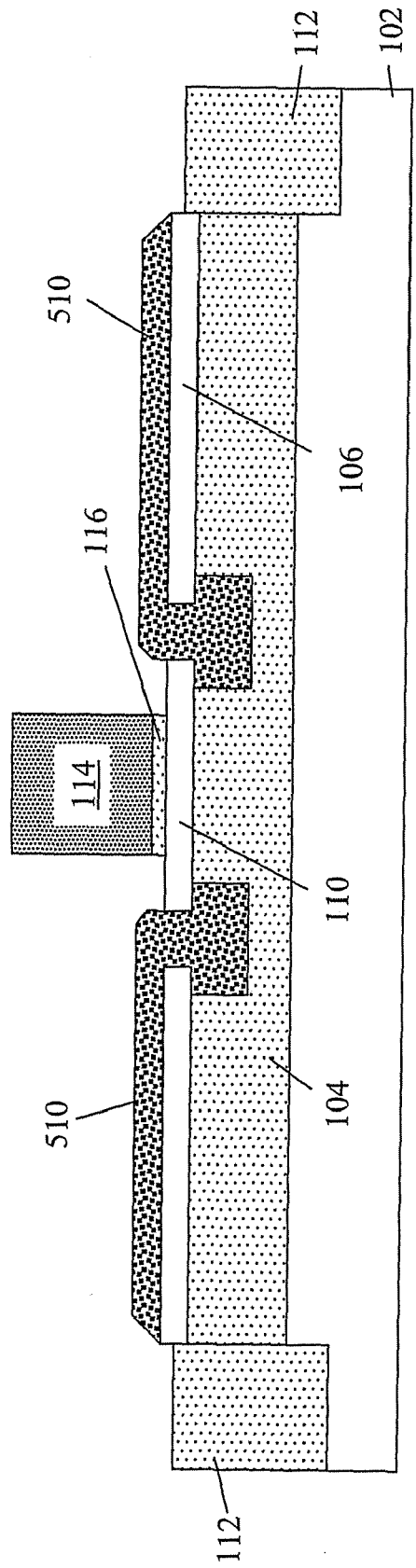
Figure 5I:
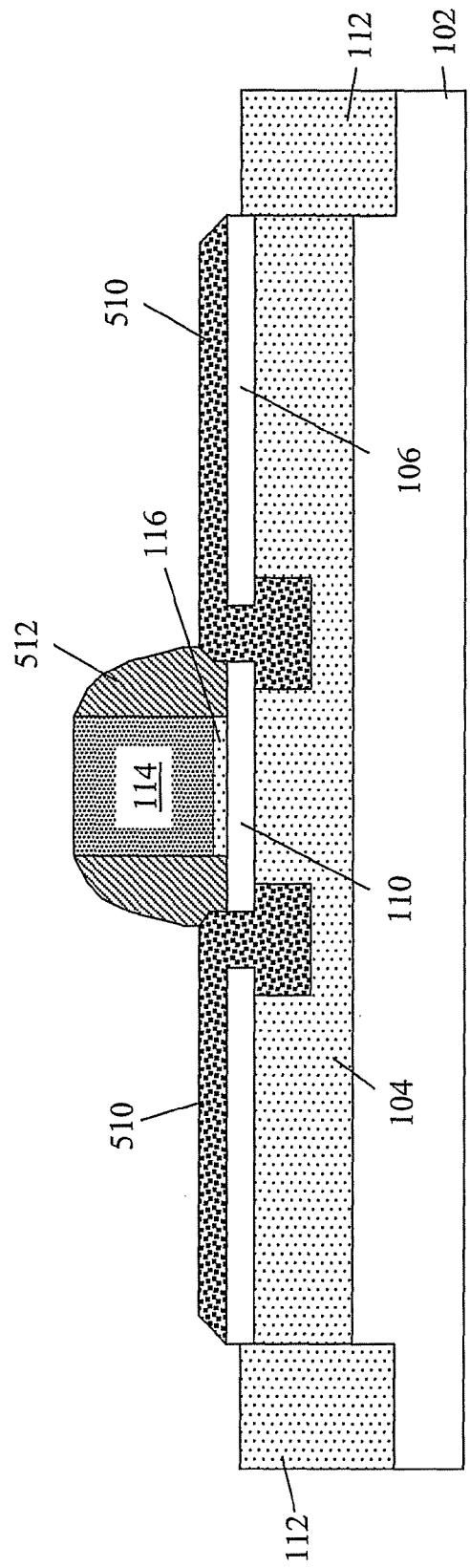

In contrast to the conventional structures described earlier, it will be noted that the epitaxial regions 510 have an extended interface with the extension regions of the ETSOI layer 106, since this boundary extends along both the vertical surfaces of the ETSOI layer 106 and a portion of the bottom surface 508 thereof. Not only does this configuration offer superior channel strain performance, but also addresses the extension resistance problem by providing a semiconductor "ledge" below the extension regions. Thus, if the dopant is activated by thermal anneal, the epitaxial regions 510 also prevent the dopant ions from diffusing from the extension regions into the BOX 104. From this point, additional transistor manufacturing steps as known in the art may be performed. For example, FIG. 5(h) illustrates the removal of the disposable spacer and gate hardmask material. Extension and halo implants could also be performed at this stage. Then, as shown in FIG. 5(i), the final gate spacers 512 are formed, followed by deep source/drain implantation. Optionally, the extension implants could be performed after the deep source/drain implants. In any case, dopant implantation is then followed by conventional processing steps, such as for example, silicide formation, stress liner formation and back end of line (BEOL) formation.

Figure 6A:
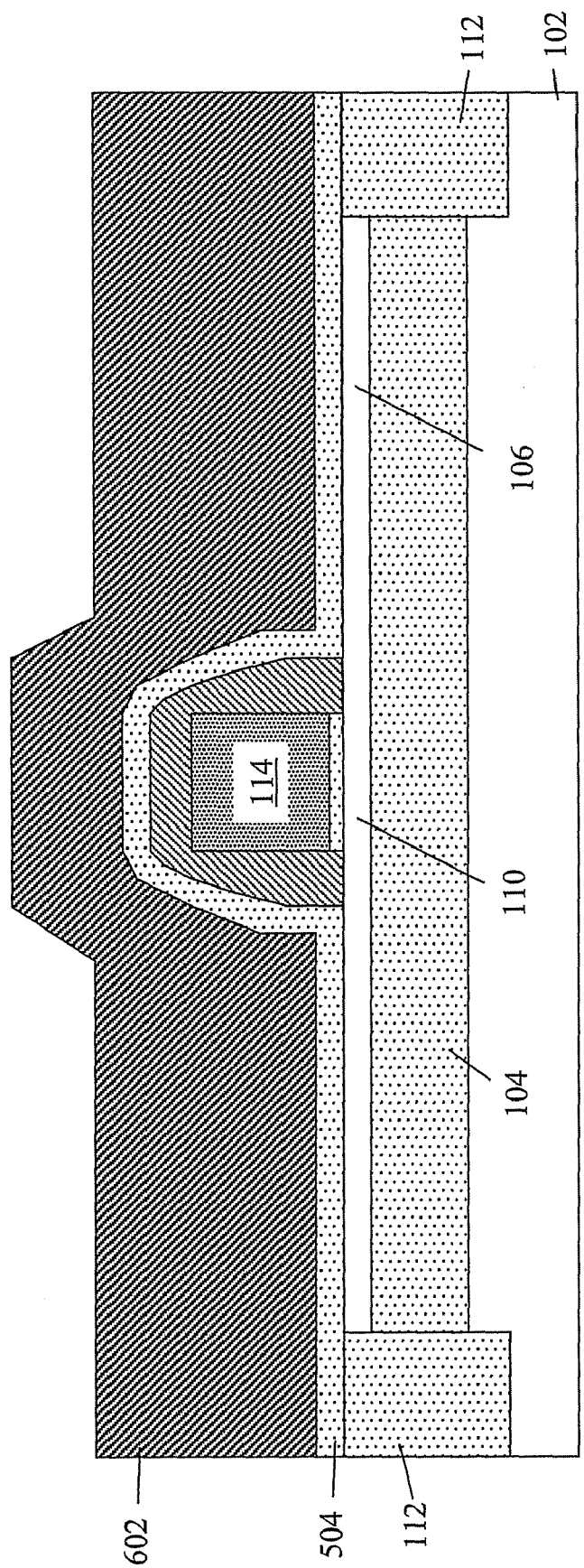
FIGS. 6(a) through 6(c) are a series of cross-sectional views illustrating an alternative, self-aligned embodiment of the patterning shown in FIGS. 5(c) and 5(d)
Figure 6B:
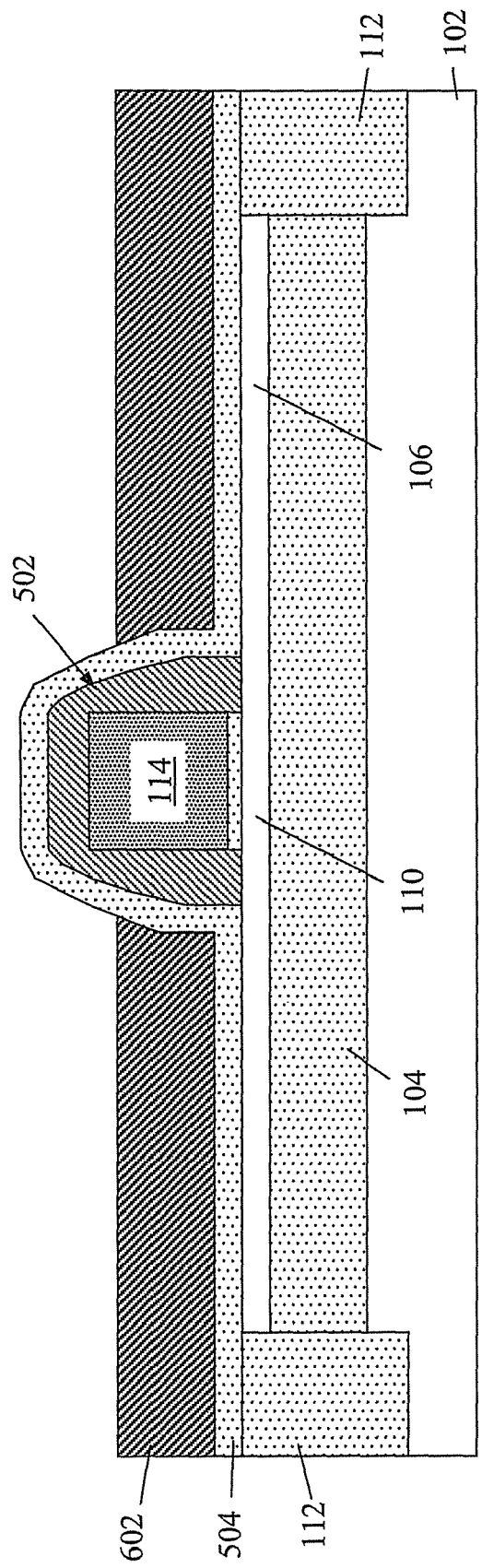
Figure 6C:
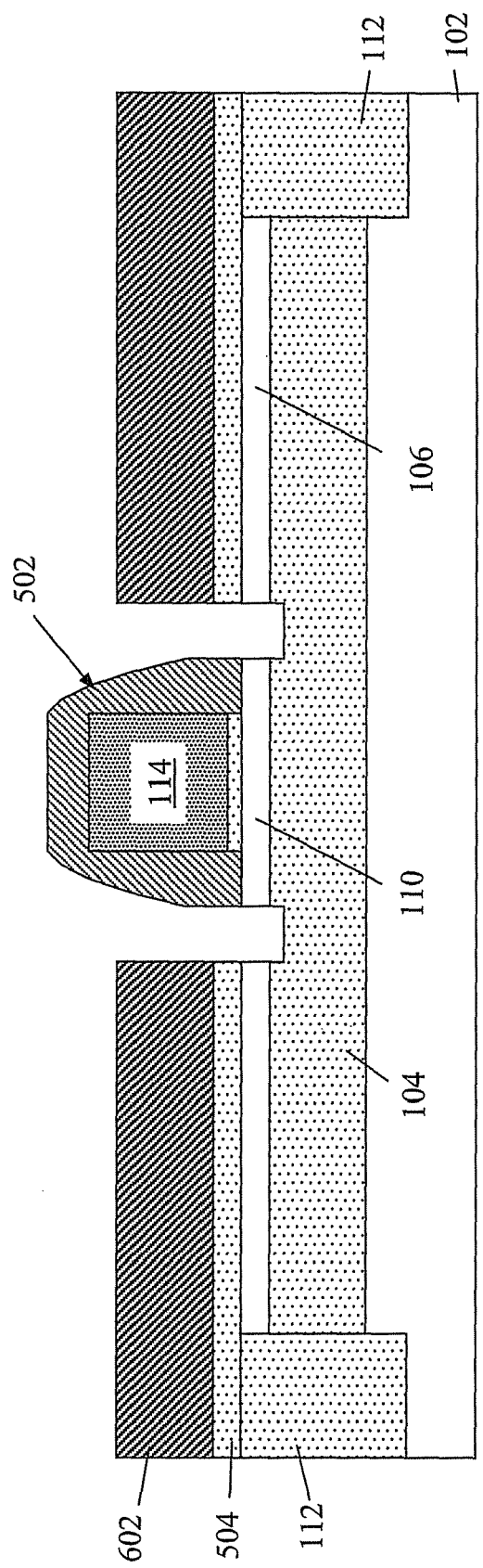

As an alternative to non self-aligned patterning prior to the SOI etch and lateral BOX etch as particularly shown in FIGS. 5(c) and 5(d), the device shown in FIG. 5(i) could also be formed by one or more variations of a self-aligned approach with respect to the gate conductor. For example, FIGS. 6(a) through 6(c) illustrate a method of forming a novel SOI transistors having an embedded extension region for improved extension resistance and channel strain characteristics, in accordance with another exemplary embodiment of the invention. More specifically, the initial processing steps in FIGS. 5(a) and 5(b) may be repeated up through the deposition of the sacrificial oxide liner 504 as shown in FIG. 5(b). However, instead of applying a photoresist material, another sacrificial layer 602 is then formed over the sacrificial oxide liner 504, as illustrated in FIG. 6(a). The sacrificial layer 602 may include a material that has a different etch rate with respect to oxide or nitride such as, for example, polysilicon or polySiGe.

In FIG. 6(b), the sacrificial layer 602 is planarized and recessed, thereby exposing only the vertical surfaces of the sacrificial oxide liner 502 and the top surface thereof over the gate conductor 114. Then, as shown in FIG. 6(c), an oxide etch removes the exposed portions of the sacrificial oxide liner 502, followed by another etch to remove the exposed portions of the ETSOI layer 106 surrounding the channel region 110. As is the case with the FIG. 5 sequence, the ETSOI etch results in a slight recess into the BOX layer 104. Upon subsequent removal of the remaining part of the sacrificial layer 602, the resulting structure then appears substantially the same as that shown in FIG. 5(e). Accordingly, the lateral isotropic etch and epitaxial growth steps are then carried out per the above description with reference to FIGS. 5(f) through 5(i).

Figure 7A:
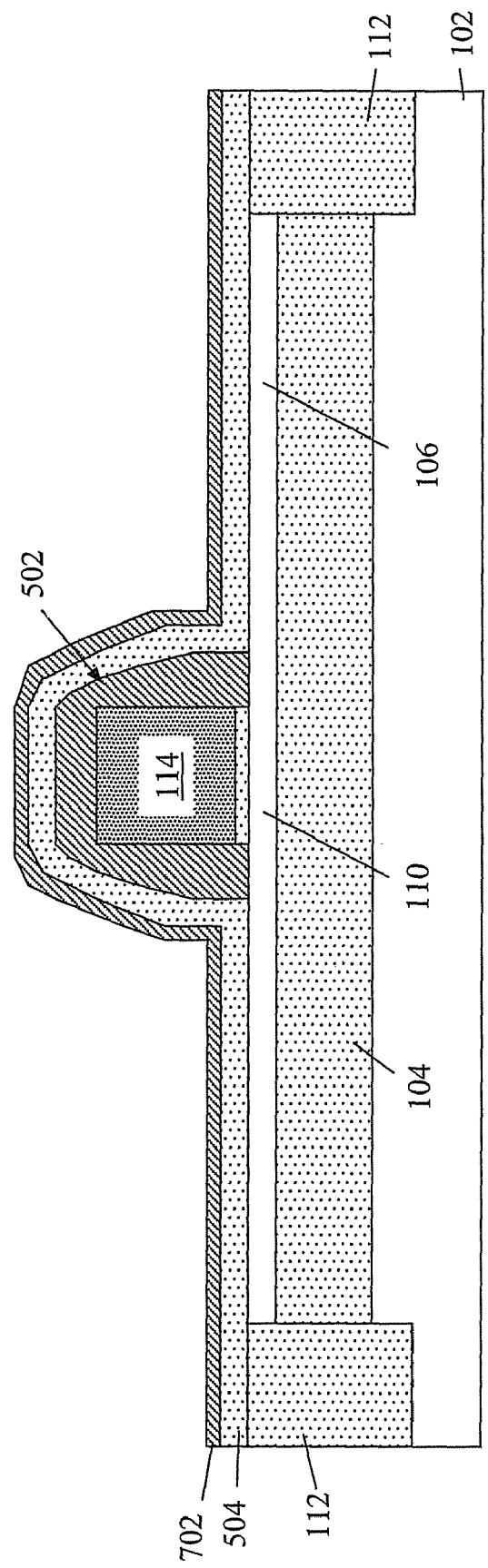
FIGS. 7(a) through 7(e) are a series of cross-sectional views illustrating still another alternative, self-aligned embodiment of the patterning shown in FIGS. 5(c) and 5(d)
Figure 7B:
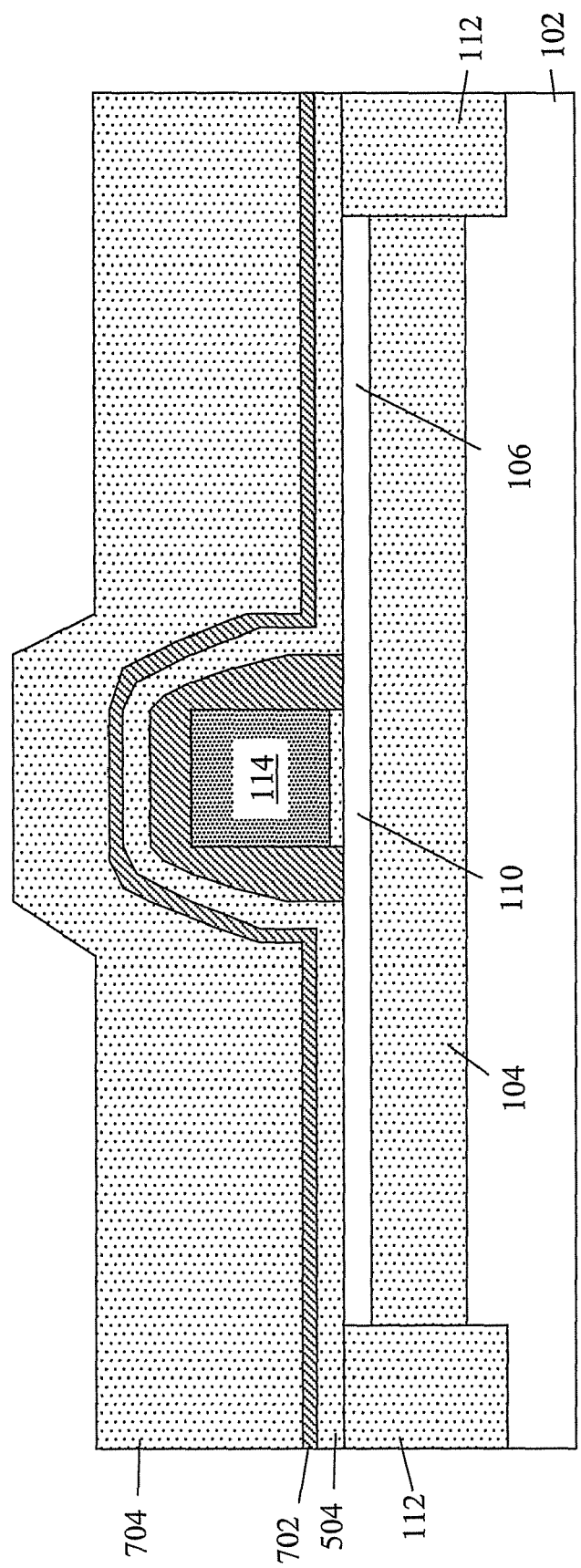
Figure 7C:
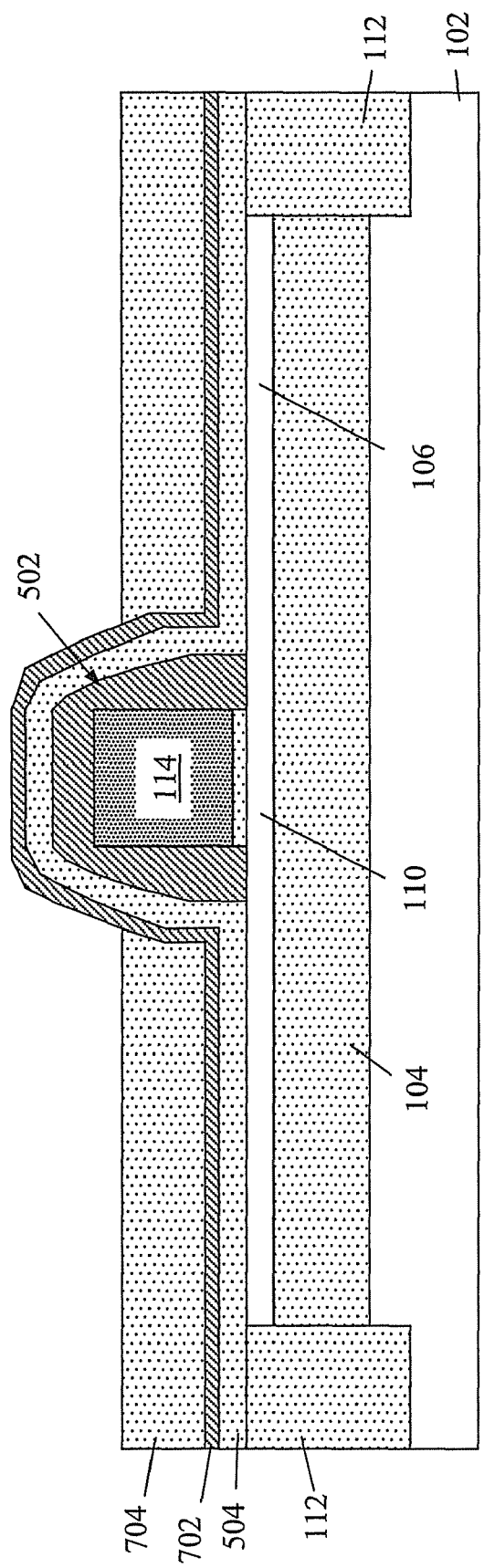

Still another embodiment for performing a self-aligned patterning prior to the SOI etch and lateral BOX etch is shown in FIGS. 7(a) through 7(e). In lieu of using a second sacrificial layer with an etch rate selective to oxides and nitrides, an oxide-nitride-oxide sacrificial layer combination may be used. Once again, the initial processing steps in FIGS. 5(a) and 5(b) may be repeated up through the deposition of the sacrificial oxide liner 504 as shown in FIG. 5(b). Then, as shown in FIG. 7(a), a thin sacrificial nitride liner 702 is formed over the sacrificial oxide liner 504. In FIG. 7(b), another sacrificial oxide layer 704 is deposited, followed by oxide planarization and recess as shown in FIG. 7(c). This exposes the vertical surfaces of the sacrificial nitride liner 702 and the top surface thereof over the gate conductor 114. It will be noted that the sacrificial oxide layer 704 is comparable in thickness to that of layer 602 of the previous embodiment, but because of the use of the thin sacrificial nitride liner 702, the relatively thicker sacrificial layer 704 may be an oxide.

Figure 7D:
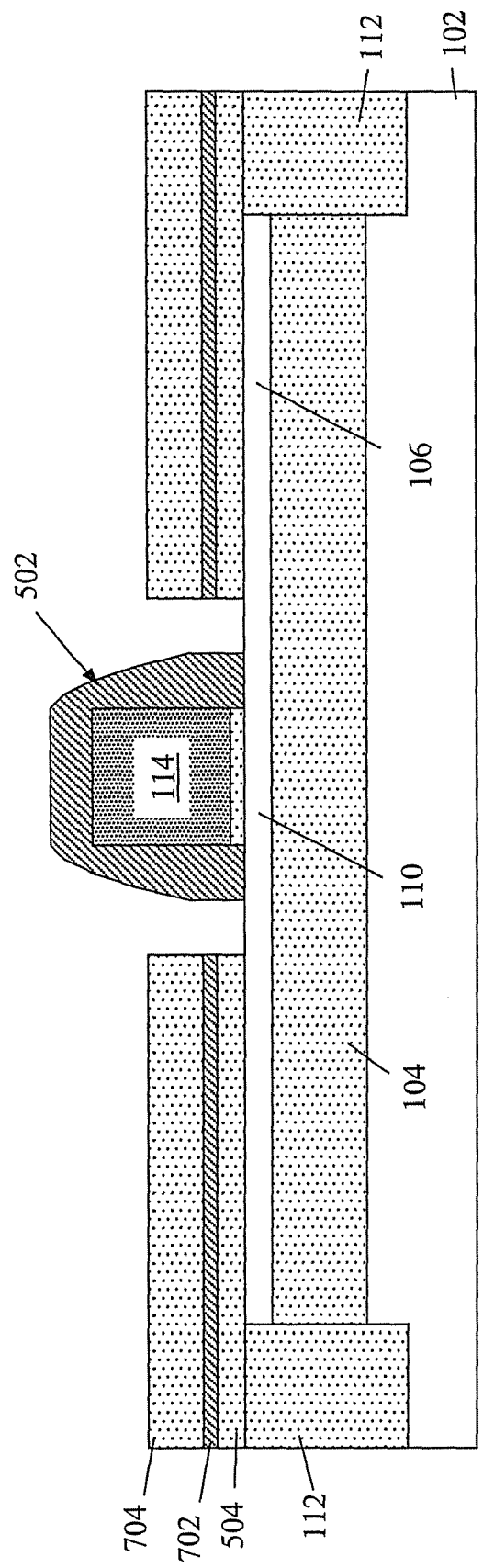
Figure 7E:
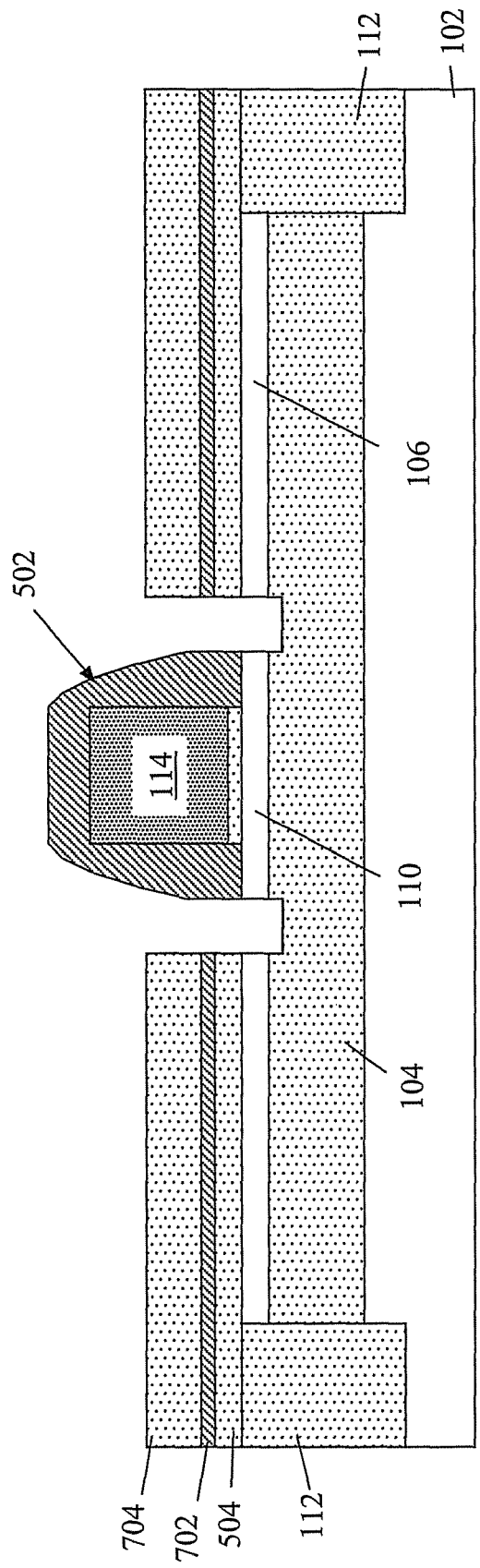

Referring next to FIG. 7(d), a nitride etch removes the exposed portions of the sacrificial nitride liner 702, followed by an oxide etch to remove the exposed portions of the sacrificial oxide liner 504, revealing the top surfaces of the ETSOI layer 106 adjacent the ends of the channel region 110. Notably, this oxide etch also thins the top sacrificial oxide layer 704. Then, as shown in FIG. 7(e), an etch is performed to remove the exposed portions of the ETSOI layer 106, with a slight recess into the BOX layer 104. Thereafter, the remaining sacrificial materials (oxide layer 704, nitride liner 702 and oxide liner 504 are removed, after which the resulting structure then appears substantially the same as that shown in FIG. 5(e). Accordingly, the lateral isotropic etch and epitaxial growth steps are then carried out per the above description with reference to FIGS. 5(f) through 5(i).

Figure 8A:
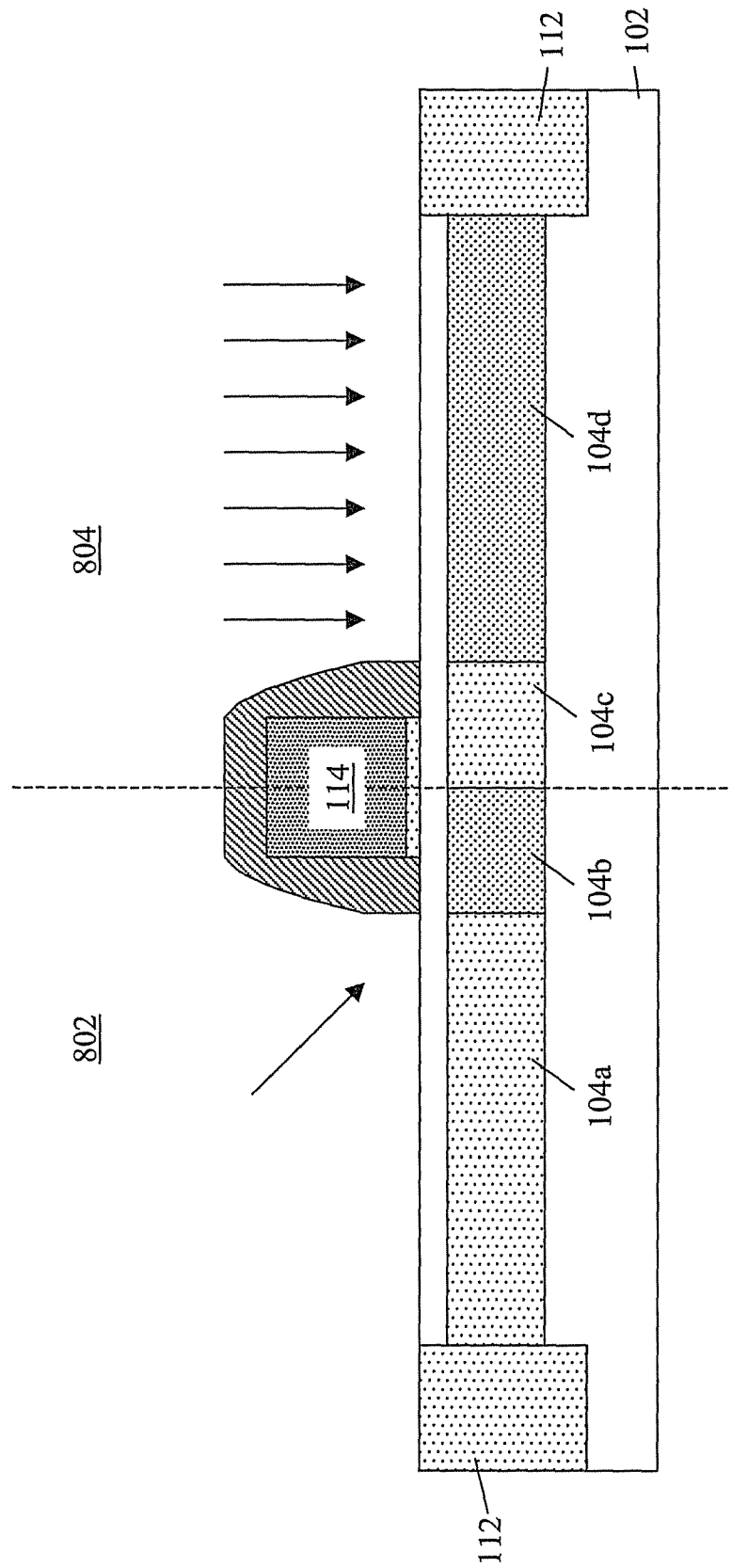
FIGS. 8(a) through 8(c) are a series of cross-sectional views illustrating a method of tailoring the BOX dielectric etch profile in accordance with an alternative embodiment of the invention.
Figure 8B:
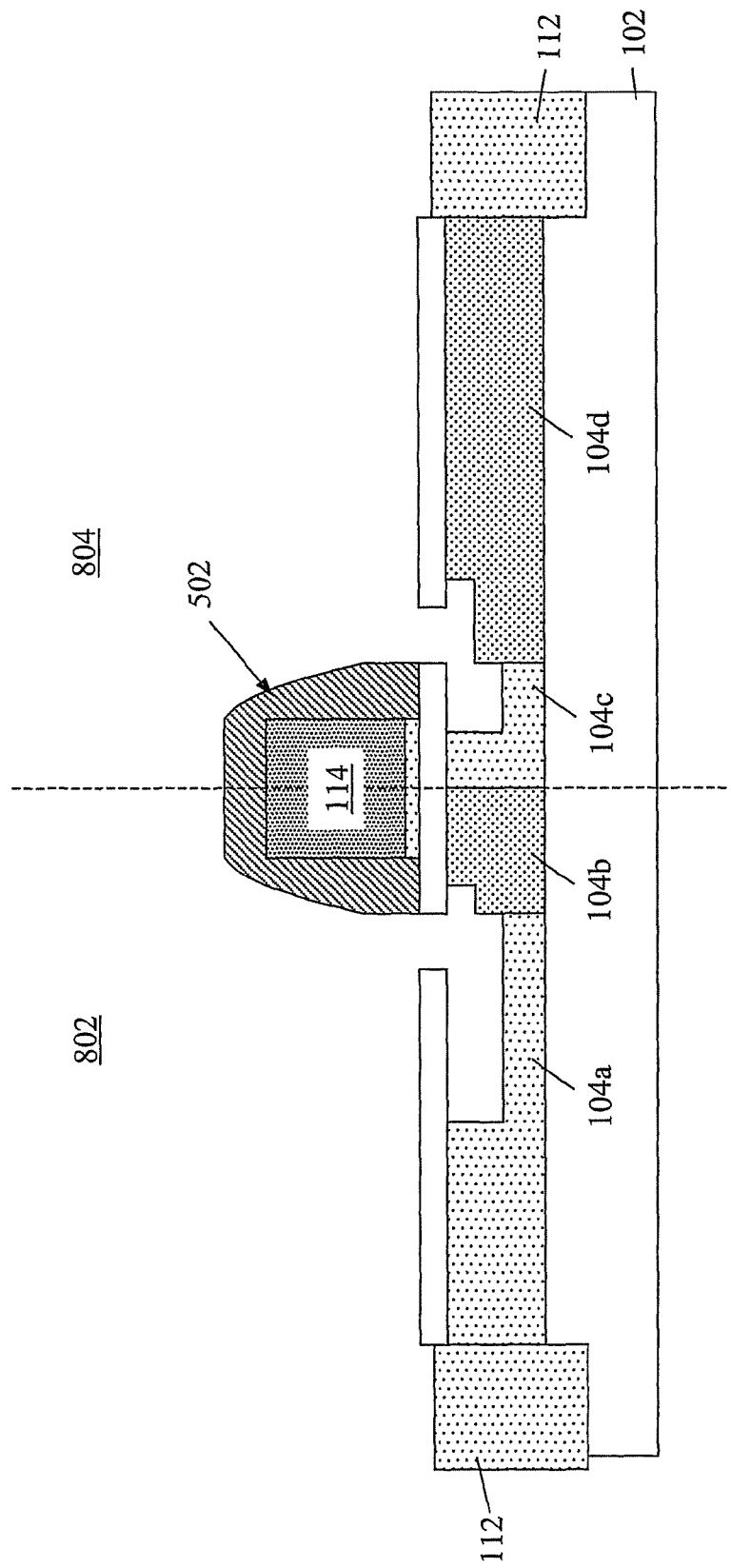
Figure 8C:
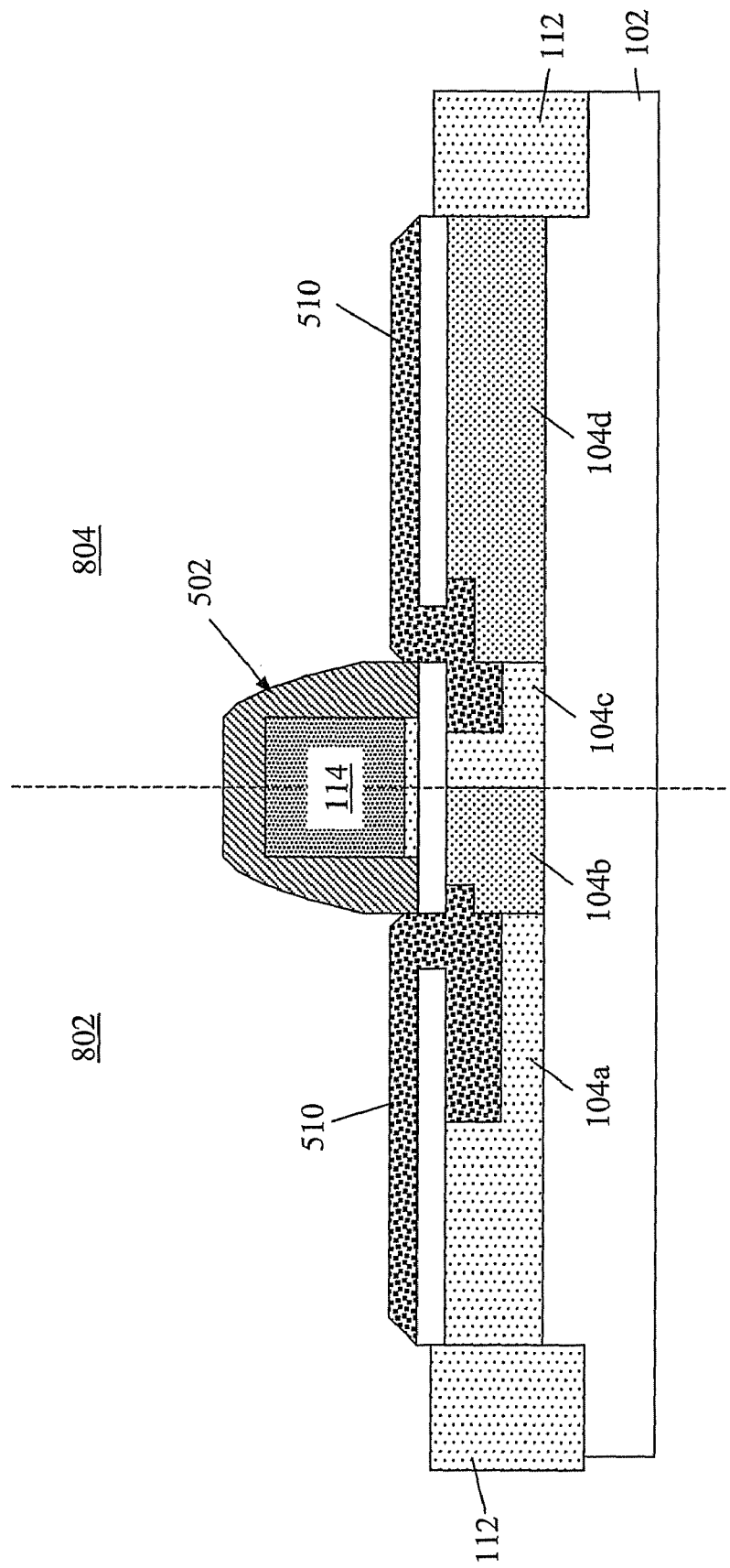

In the embodiments described to this point, the lateral etch profile into the BOX layer 104 (shown most particularly in FIG. 5(f)) is substantially symmetrical with respect to the source and drain sides of the channel. However, it is also contemplated that the lateral etch profile of the BOX layer 104 may be tailored so as to control the final aspect ratio and geometry of the epitaxial regions. To this end, FIGS. 8(a) through 8(c) are a series of cross-sectional views illustrating a method of tailoring the SOI etch profile in accordance with an alternative embodiment of the invention. In essence, the BOX layer 104 is subjected to an ion implant (e.g., blanket or patterned, angled, vertical, etc.) so as to produce regions therein having differential oxide etch rates. The BOX implant may be performed following a point in device processing as was described above with reference to FIG. 5(a) (i.e., prior to sacrificial layer formation).

As particularly shown in FIG. 8(a), the BOX layer is subjected to one or more implants that result in the box layer having regions 104a, 104c of a relatively high etch rate and regions 104b, 104d of a relatively low etch rate. In this specific example, side 802 (e.g., source or drain) of the FET device is subjected to an angled implant that produces low etch rate region 104b below the source or drain extension region and channel region. In addition, side 804 (e.g., drain or source) of the FET device is subjected to a vertical (0°) implant that produces low etch rate region 104d. It should be appreciated that this BOX implant profile shown in FIG. 8(a) represents just a single example of how the etch rate within the BOX layer 104 may be tailored, and that other profiles are also contemplated.

Following the BOX implant, device processing may continue according to any of the embodiments of FIGS. 5(a) though 5(e), FIGS. 6(a) through 6(c), or FIGS. 7(a) through 7(e) that (except for the doped BOX profile) results in any of the structures as shown in 5(e), 6(c) or 7(e). That is, an FET structure where the portions of ETSOI layer 106 has been completely etched through in the manner described, with a slight recess into the BOX layer. Then, upon performance of the lateral oxide etch as shown in FIG. 8(b), it will be seen that the resulting etch profile of the BOX layer is asymmetric. That is, the regions 104a and 104c have been etched at a faster rate than the regions 104b and 104d. On the other hand, it should be noted that even through region 104b has a lower etch rate that region 104c, the bottom surface of the ETSOI layer corresponding to region 104b is still exposed for subsequent epitaxial growth thereon. This is illustrated in FIG. 8(c), which depicts the growth of epitaxial regions 510 in accordance with the asymmetrical etch profile. From this point on, processing may continue as was illustrated in FIGS. 5(h) and 5(i).

To this point, the discussed exemplary embodiments have been directed toward ETSOI devices that are essentially too thin for "embedded" epitaxial regions, and thus the source/drain regions are "raised" with respect to the gate conductor. Although FET devices with thicker SOI layers are generally less susceptible to extension resistance and strain problems, it is further contemplated herein that the above described techniques may also be applied to thicker SOI devices.

Figure 9A:
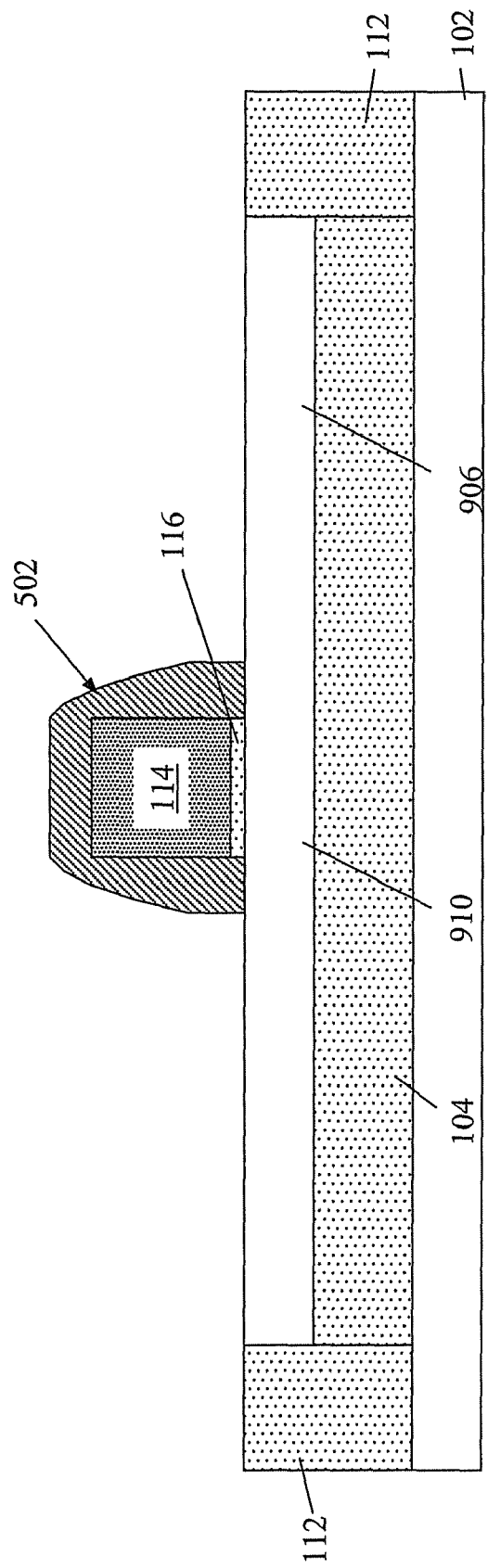
FIGS. 9(a) through 9(h) are a series of cross-sectional views illustrating a method of forming an SOI transistor having an embedded extension region for improved extension resistance and channel strain characteristics, in accordance with another exemplary embodiment of the invention.

Accordingly, FIGS. 9(a) through 9(h) are a series of cross-sectional views illustrating a method forming an SOI transistor having an embedded extension region for improved extension resistance and channel strain characteristics, in accordance with another exemplary embodiment of the invention. In FIG. 9(a), a point in device processing is depicted in which the SOI layer 906 is initially relatively thick compared to ETSOI dimensions, STI regions 112 are formed within the bulk substrate 102, gate stack materials are deposited, patterned and etched to form the gate electrode 114 and gate dielectric layer 116. FIG. 9(a) further illustrates disposable spacer, liner and gate hardmask formation, collectively designated by 502.

Figure 9B:
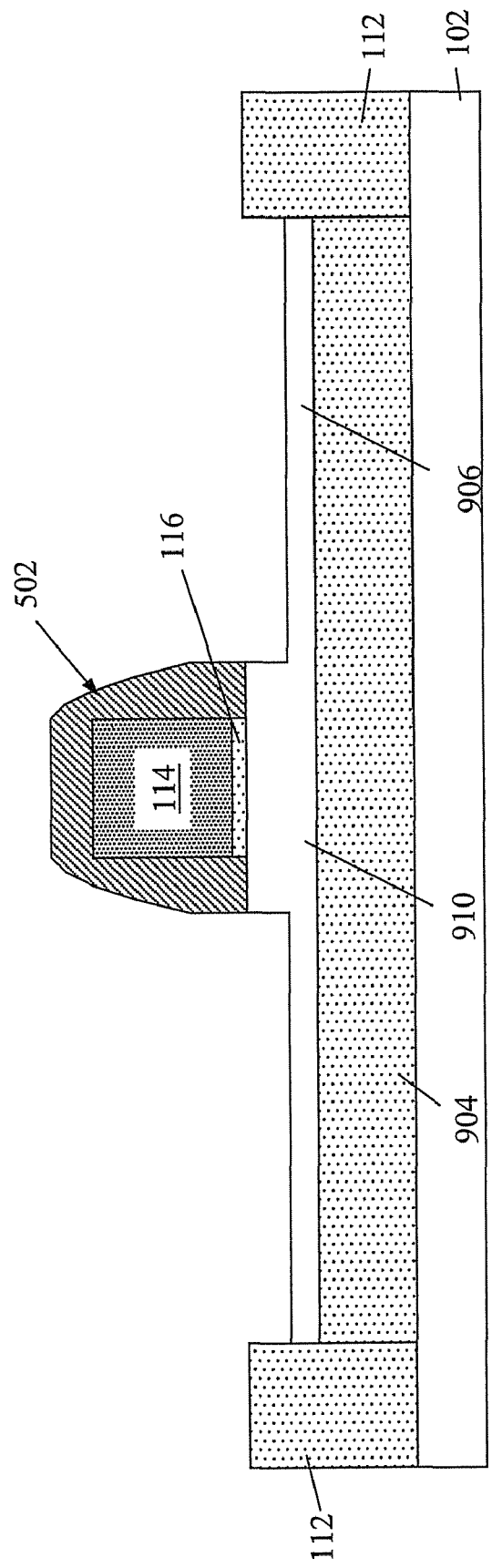
Figure 9C:
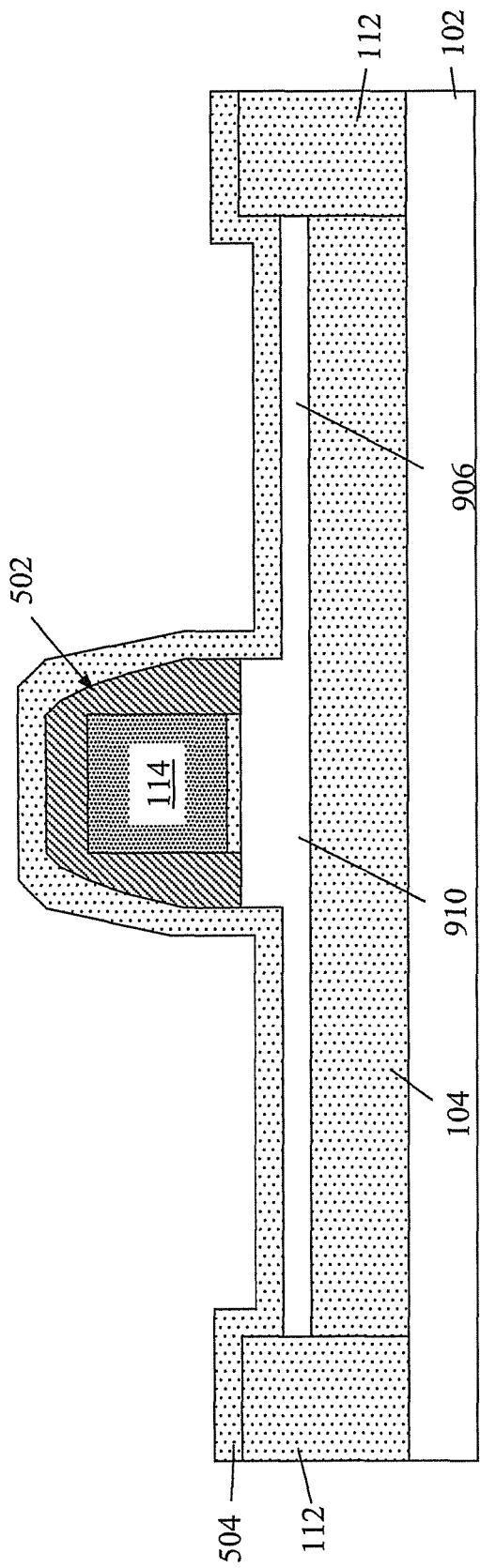

Because of the relatively large initial thickness of the SOI layer 906, the SOI layer 906 may be recessed as shown at locations outside the channel region 110 as shown in FIG. 9(b). As then shown in FIG. 9(c), a sacrificial oxide liner layer 504 is deposited over the entire structure. The structure at the point in processing in FIG. 9(c) is similar to that shown in FIG. 5(b), except that the SOI below corresponding source/drain regions is recessed and thinner with respect to the SOI corresponding to the channel region. From this point, any of the patterning embodiments described in the process flow sequences of FIGS. 5, 6 or 7 can then be used to define the locations for lateral BOX etching. For purposes of illustration only, the remaining sequence figures in this embodiment are illustrated using the non self-aligned pattering with photoresist similar to FIG. 5(c), but it should be understood that the multiple sacrificial liner/layer, self-aligned embodiments of FIGS. 6 or 7 are also applicable.

Figure 9D:
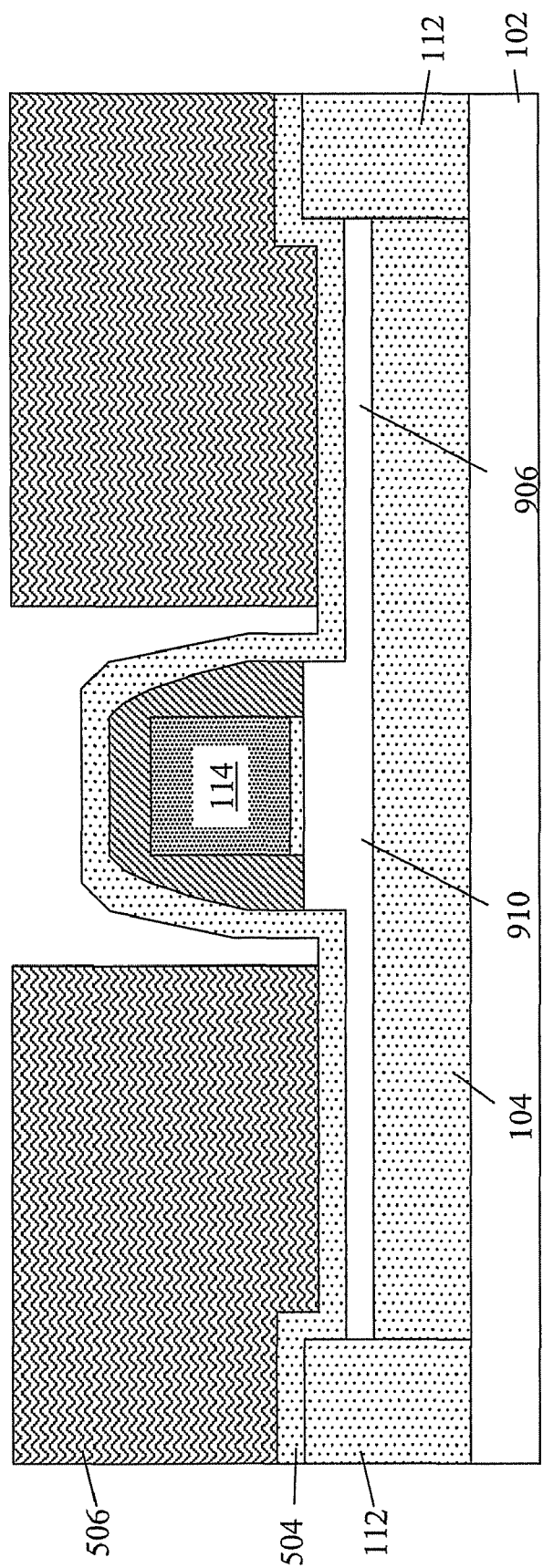
Figure 9E:
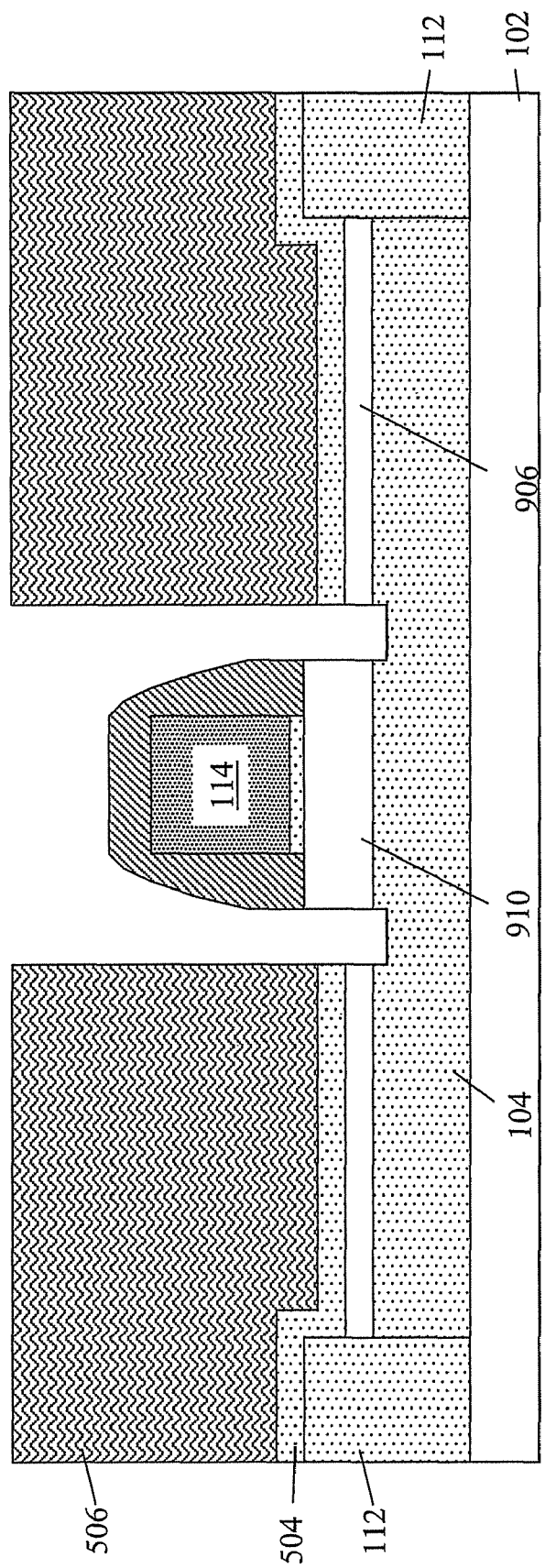
Figure 9F:
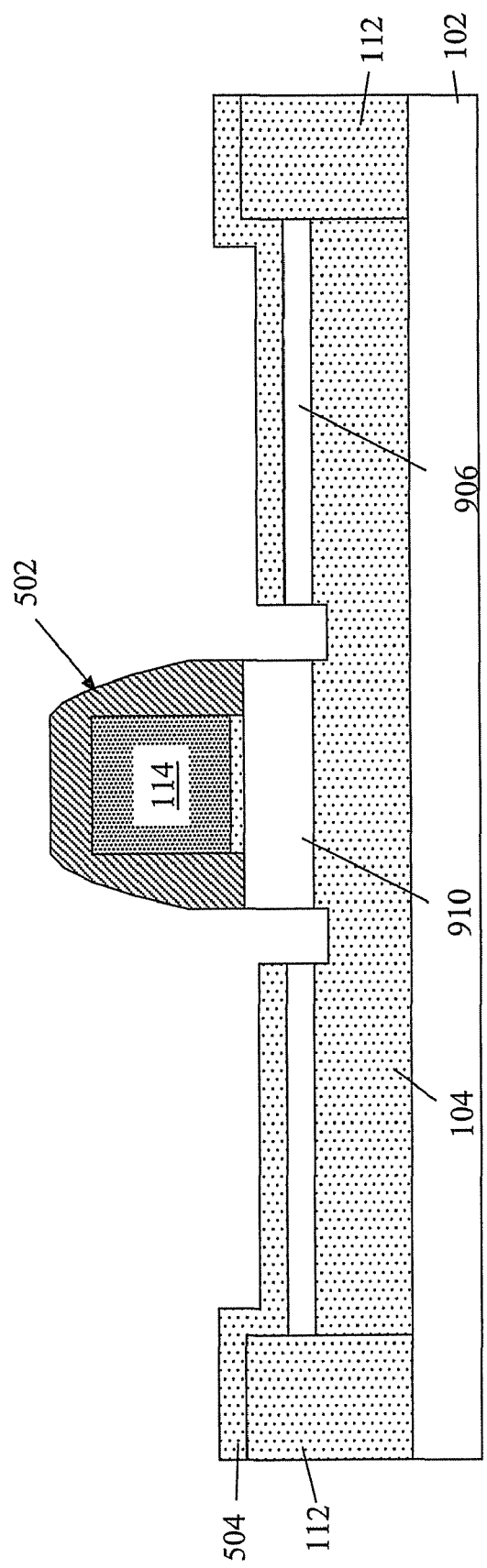

As shown in FIG. 9(d), a photoresist layer 906 is deposited and patterned as known in the art to expose the gate electrode 114, the sacrificial spacer/hardmask layer 502, and vertical surfaces of the sacrificial oxide liner 504. Again, the embodiment of this particular sequence is non self-aligned with respect to the gate in that photolithography is used to form an etch pattern. An etch process is then used to remove the exposed portions of the oxide liner 504, followed by another etch process to etch completely through the exposed portion of the recessed SOI layer 906 at opposing ends of the channel region 910, and also slightly recessing into the BOX layer 104 as shown in FIG. 9(e). In FIG. 9(f), the resist layer is then stripped.

Figure 9G:
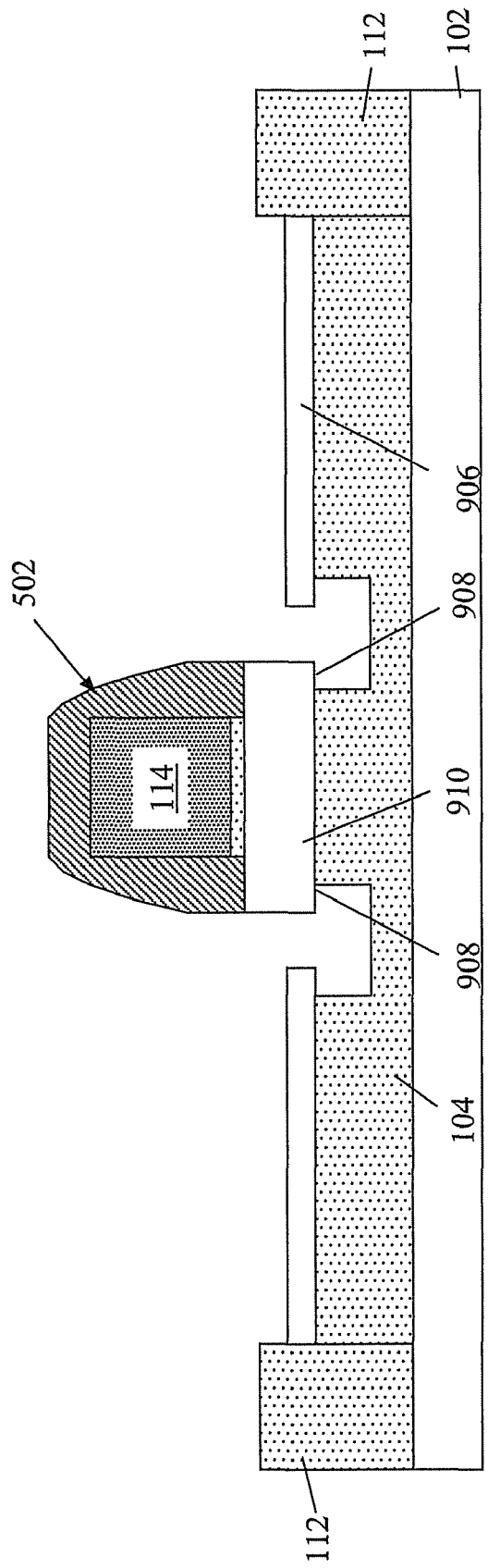
Figure 9H:
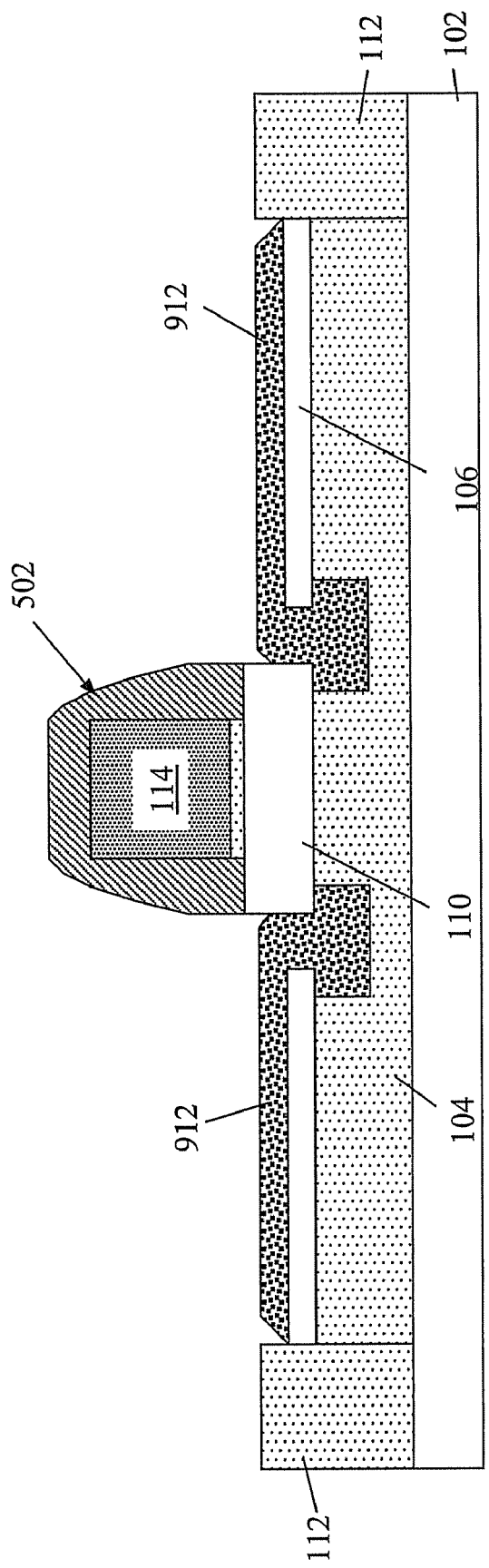

Proceeding next to FIG. 9(g), an isotropic oxide etch is then performed (such as a wet etch or a reactive ion etch (RIE), for example) in order to laterally etch the BOX layer 104 and expose a bottom surface 908 of the SOI layer 106 corresponding to the source/drain extension regions at opposing ends of the channel region 910. In so doing, the sacrificial oxide liner is also removed, but in so doing, protects against significant recessing of the STI regions 112. Then, as shown in FIG. 9(h), epitaxial growth of a suitable silicon-containing semiconductor material (e.g., SiGe, SiC, depending on the device polarity) is performed in order to define epitaxial embedded extension regions and embedded source/drain regions 912. The epitaxial embedded regions 912 are embedded with respect to the gate conductor 114 in that the SOI region 106 is initially recessed prior to epitaxial growth so that the top surface of the epitaxial regions 912 do not substantially overlap with the bottom surface of the gate conductor 114, preventing additional gate-to source and gate-to-drain capacitance. At this point in the process, extension (and halo) implants may be performed.

As is the case with the previously described ETSOI embodiments, the epitaxial regions 912 have an extended interface with the extension regions of the SOI layer 906, since this boundary extends along both the vertical surfaces of the SOI layer 906 and a portion of the bottom surface 908 thereof. From this point, additional transistor manufacturing steps as known in the art may be performed, such as those shown, for example, in FIG. 5(h) and FIG. 5(i).

Figure 10A:
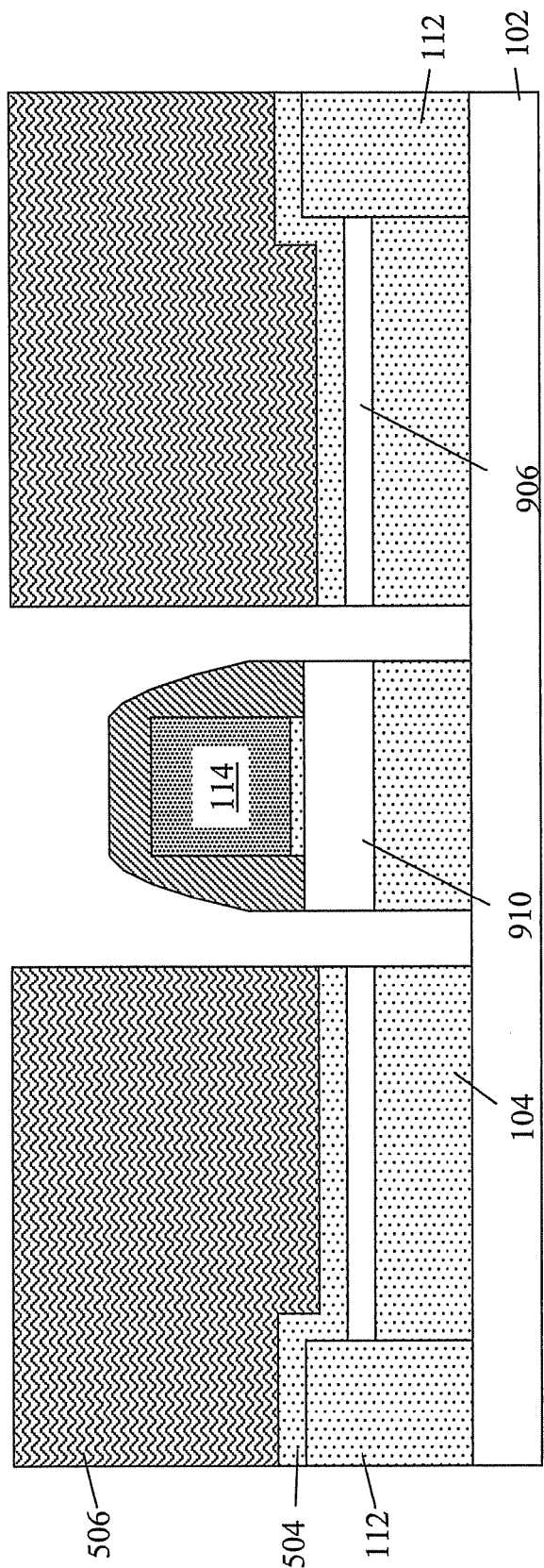
FIGS. 10(a) through 10(d) are a series of cross-sectional views illustrating a method of forming an SOI transistor in accordance with another exemplary embodiment of the invention.
Figure 10B:
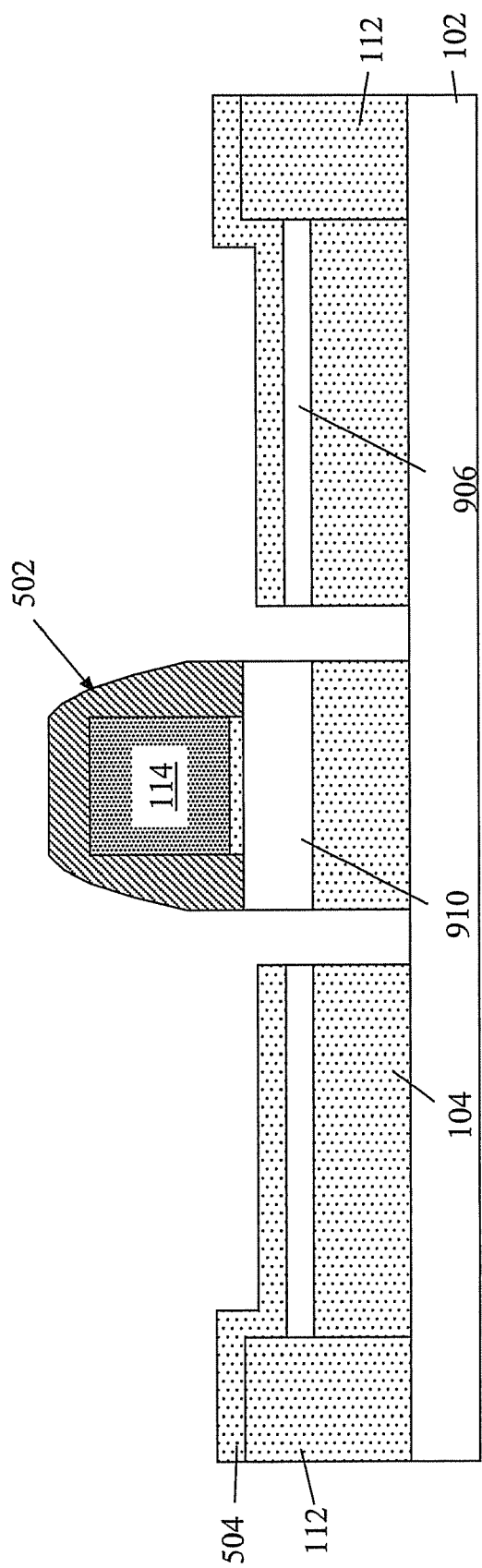
Figure 10C:
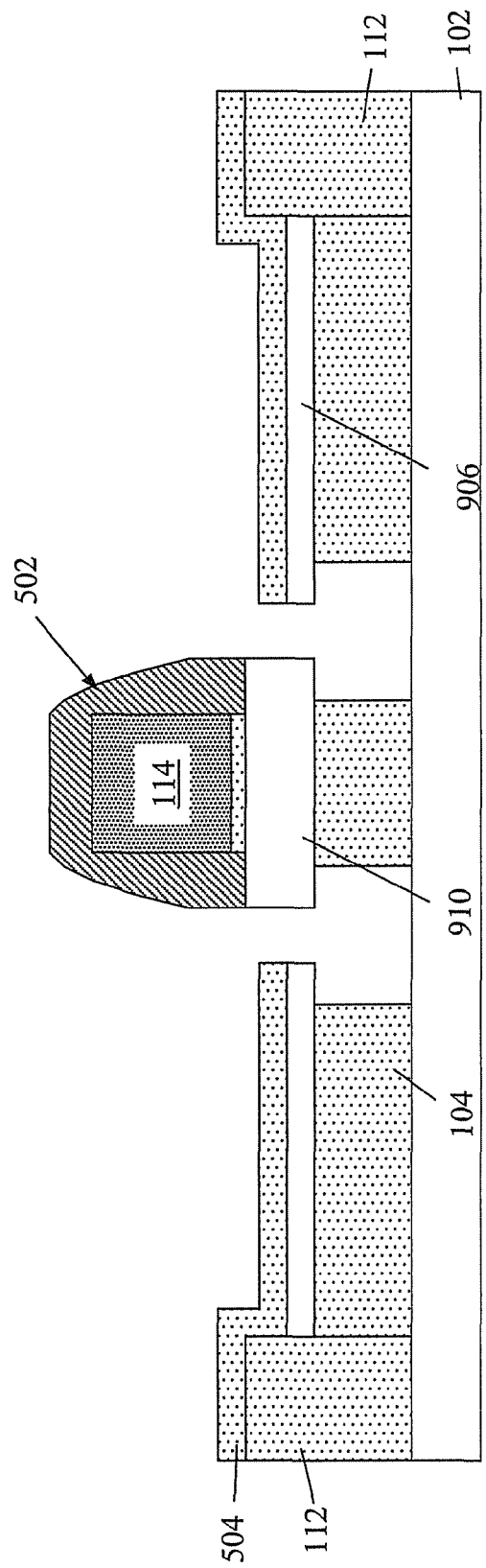
Figure 10D:
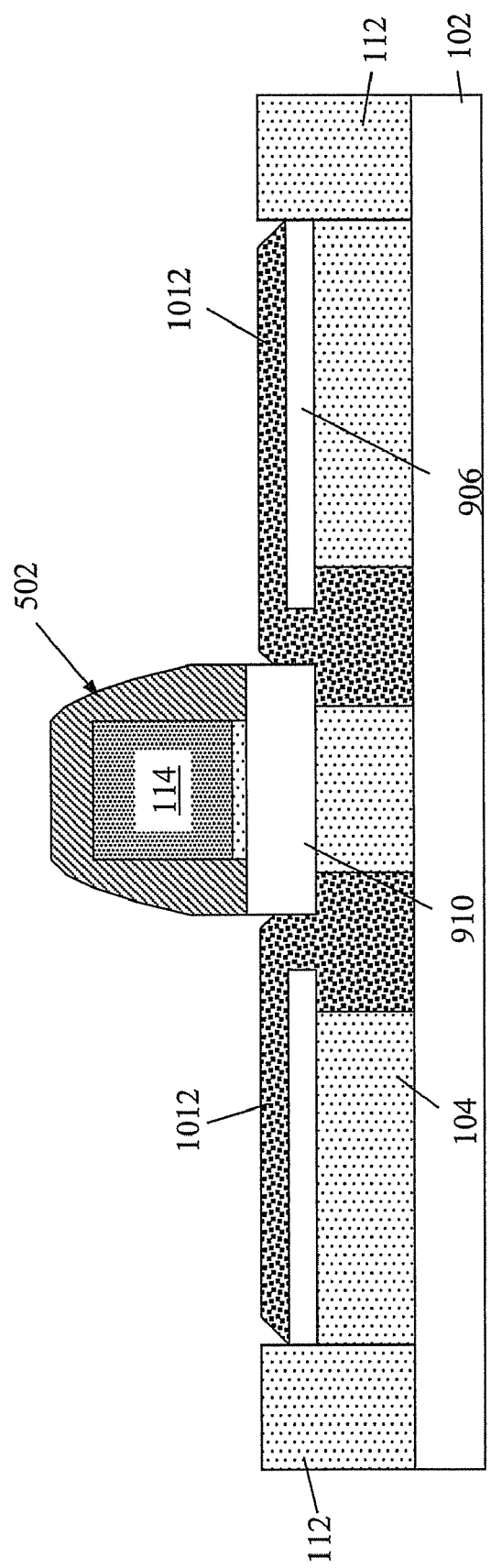

Finally, FIGS. 10(a) through 10(d) illustrate an alternative embodiment for the lateral etch process of the BOX layer of the SOI transistor of FIGS. 9(a) through 9(h). For the embedded epitaxial source/drain device, the pattern used to etch through the recessed SOI layer 906 may also be used to completely etch through the BOX layer 104 and stopping on the bulk substrate 102, as shown in FIG. 10(a). After removal of the resist layer 506 in FIG. 10(b), the BOX layer 104 is laterally etched as shown in FIG. 10(c). Although the isotropic lateral etch depicted is substantially symmetrical, it should be appreciated that the BOX doping as described in FIGS. 8(a) through 8(c) can also be utilized to create a tailored BOX etch profile. Following the BOX etch, the embedded epitaxial regions 1012 are grown as shown in FIG. 10(d). The same approach can be used for the ETSOI devices described in FIGS. 5, 6, and 7, where the pattern used to etch through recessed SOI layer may also be used to completely etch through the BOX layer and stopping on the bulk substrate.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A silicon-on-insulator (SOI) transistor device, comprising:
  a buried insulator layer formed over a bulk substrate;
  an SOI layer formed on the buried insulator layer; and
  a pair of silicon containing epitaxial regions disposed adjacent opposing sides of a gate conductor, the epitaxial regions corresponding to source and drain regions of the transistor device;
  wherein portions of the epitaxial regions are embedded in the buried insulator and are in contact with top, vertical and bottom surfaces of a first portion of the SOI layer, and with vertical and bottom surfaces of a second portion of the SOI layer corresponding to source and drain extension regions at opposing ends of a channel region of the transistor device.

2. The device of claim 1, wherein the epitaxial regions comprise embedded regions with respect to the SOI layer and the gate conductor.

3. The device of claim 2, wherein bottom surfaces of the epitaxial regions are in contact with the bulk substrate.

4. The device of claim 2, wherein bottom surfaces of the epitaxial regions are in contact with the bulk substrate.

5. The device of claim 1, wherein the epitaxial regions comprise silicon germanium (SiGe).

6. The device of claim 1, wherein the epitaxial regions comprise silicon carbide (SiC).

7. The device of claim 1, wherein the epitaxial regions comprise raised source/drain regions with respect to the gate conductor.

8. A silicon-on-insulator (SOI) transistor device, comprising:
  a buried insulator layer formed over a bulk substrate;
  an SOI layer formed on the buried insulator layer; and
  a pair of silicon containing epitaxial regions disposed adjacent opposing sides of a gate conductor, the epitaxial regions corresponding to source and drain regions of the transistor device;
  wherein portions of the epitaxial regions are embedded in the buried insulator and are in contact with both vertical and bottom surfaces of the SOI layer corresponding to source and drain extension regions at opposing ends of a channel region of the transistor device; and
  wherein portions of the buried insulator layer are doped so as to result in differential etch rates therein, thereby resulting in an asymmetrical profile of the portions of the epitaxial regions that are in contact with both vertical and bottom surfaces of the SOI layer corresponding to source and drain extension regions.

9. A method of forming a silicon-on-insulator (SOI) transistor device, the method comprising:
  forming a first sacrificial layer over a starting structure, the starting structure comprising a buried insulator layer formed over a bulk substrate, an SOI layer formed on the buried insulator layer, a gate conductor and gate insulator layer formed over the SOI layer, and a disposable spacer layer formed over and on sidewalls of the gate conductor;
  removing portions of the first sacrificial layer that are disposed adjacent opposing sides of the disposable spacer layer and gate conductor;
  removing corresponding exposed portions of the SOI layer disposed adjacent opposing sides of the disposable spacer layer and gate conductor;
  downwardly and laterally etching the buried insulator layer so as to expose both vertical and bottom surfaces of the SOI layer corresponding to source and drain extension regions at opposing ends of a channel region of the transistor device; and
  growing a pair of silicon containing epitaxial regions disposed adjacent opposing sides of a gate conductor, the epitaxial regions corresponding to source and drain regions of the transistor device and filling the etched portions of the buried insulator layer;
  wherein portions of the epitaxial regions are in contact with the vertical and bottom surfaces of the SOI layer corresponding to source and drain extension regions at the opposing ends of the channel region of the transistor device.

10. The method of claim 9, wherein:
  the buried insulator is a buried oxide layer (BOX);
  the first sacrificial layer comprises an oxide liner; and
  the downward and lateral etch of the BOX comprises an isotropic etch of oxide material.

11. The method of claim 10, wherein the removing portions of the first sacrificial layer that are disposed adjacent opposing sides of the disposable spacer layer and gate conductor is implemented in a self-aligned manner with respect to the gate conductor by forming a second sacrificial layer over the first sacrificial layer, planarizing and recessing the second sacrificial layer so as to expose vertical portions of the first sacrificial layer.

12. The method of claim 11, wherein the second sacrificial layer comprises a material having a different etch rate with respect to both oxide and nitride.

13. The method of claim 10, further comprising recessing portions of the SOI layer prior to forming the first sacrificial layer such that the epitaxial regions comprise embedded regions with respect to the SOI layer and the gate conductor.

14. The method of claim 13, wherein the downward and lateral etch of the BOX layer etches completely through the BOX layer, down to the top of the bulk substrate such that bottom surfaces of the epitaxial regions are in contact with the bulk substrate.

15. The method of claim 10, wherein the epitaxial regions comprise silicon germanium (SiGe).

16. The method of claim 10, wherein the epitaxial regions comprise silicon carbide (SiC).

17. The method of claim 10, wherein the removing portions of the first sacrificial layer that are disposed adjacent opposing sides of the disposable spacer layer and gate conductor is implemented in a non self-aligned manner with respect to the gate conductor by applying and patterning a photoresist material over the first sacrificial layer.

18. The method of claim 10, wherein the removing portions of the first sacrificial layer that are disposed adjacent opposing sides of the disposable spacer layer and gate conductor is implemented in a self-aligned manner with respect to the gate conductor by forming a second sacrificial layer over the first sacrificial layer, forming a third sacrificial layer over the second sacrificial layer, and planarizing and recessing the third sacrificial layer so as to expose vertical portions of the second sacrificial layer.

19. The method of claim 18, wherein the second sacrificial layer comprises a nitride liner, and the third sacrificial layer comprises an oxide layer.

20. The method of claim 10, wherein the epitaxial regions comprise raised source/drain regions with respect to the gate conductor.

21. A method of forming a silicon-on-insulator (SOI) transistor device, the method comprising:
  forming a first sacrificial oxide layer over a starting structure, the starting structure comprising a buried oxide (BOX) layer formed over a bulk substrate, an SOI layer formed on the BOX layer, a gate conductor and gate insulator layer formed over the SOI layer, and a disposable spacer layer formed over and on sidewalls of the gate conductor;

removing portions of the first sacrificial layer that are disposed adjacent opposing sides of the disposable spacer layer and gate conductor;

removing corresponding exposed portions of the SOI layer disposed adjacent opposing sides of the disposable spacer layer and gate conductor;

downwardly and laterally etching the buried insulator layer so as to expose both vertical and bottom surfaces of the SOI layer corresponding to source and drain extension regions at opposing ends of a channel region of the transistor device;

growing a pair of silicon containing epitaxial regions disposed adjacent opposing sides of a gate conductor, the epitaxial regions corresponding to source and drain regions of the transistor device and filling the etched portions of the BOX layer;

wherein portions of the epitaxial regions are in contact with the vertical and bottom surfaces of the SOI layer corresponding to source and drain extension regions at the opposing ends of the channel region of the transistor device; and ion implanting portions of the BOX layer so as to result in differential etch rates therein, thereby resulting in an asymmetrical profile of the portions of the epitaxial regions that are in contact with both vertical and bottom surfaces of the SOI layer corresponding to source and drain extension regions.

\* \* \* \* \*